(12) United States Patent
Sasaki et al.

(10) Patent No.: US 10,910,484 B2
(45) Date of Patent: Feb. 2, 2021

(54) BIPOLAR TRANSISTOR SEMICONDUCTOR DEVICE

(71) Applicant: Murata Manufacturing Co., Ltd., Kyoto (JP)

(72) Inventors: Kenji Sasaki, Kyoto (JP); Yasuhisa Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 2 days.

(21) Appl. No.: 16/058,123

(22) Filed: Aug. 8, 2018

(65) Prior Publication Data
US 2019/0058054 A1 Feb. 21, 2019

(30) Foreign Application Priority Data
Aug. 9, 2017 (JP) .................. 2017-154054

(51) Int. Cl.
*H01L 29/739* (2006.01)
*H01L 29/737* (2006.01)
*H01L 27/082* (2006.01)
*H01L 29/08* (2006.01)
*H01L 29/10* (2006.01)
(Continued)

(52) U.S. Cl.
CPC ...... *H01L 29/7371* (2013.01); *H01L 21/8252* (2013.01); *H01L 27/0605* (2013.01); *H01L 27/0823* (2013.01); *H01L 29/0692* (2013.01); *H01L 29/0813* (2013.01); *H01L 29/0817* (2013.01); *H01L 29/0821* (2013.01); *H01L 29/1004* (2013.01); *H01L 29/41708* (2013.01); *H01L 29/42304* (2013.01); *H01L 29/66242* (2013.01); *H01L 27/0629* (2013.01)

(58) Field of Classification Search
None
See application file for complete search history.

(56) References Cited

U.S. PATENT DOCUMENTS

| 2005/0017267 A1 | 1/2005 | Kawasaki et al. |
| 2010/0047986 A1* | 2/2010 | Chen ............... H01L 27/0605 438/312 |

(Continued)

FOREIGN PATENT DOCUMENTS

| JP | 2004-363322 A | 12/2004 |
| JP | 2006-114698 A | 4/2006 |

(Continued)

*Primary Examiner* — Hung K Vu
(74) *Attorney, Agent, or Firm* — Pearne & Gordon LLP

(57) ABSTRACT

On a single-crystal semiconductor substrate with an upper surface including a first direction in which an inverted mesa step extends and a second direction in which a forward mesa step extends in response to anisotropic etching in which an etching rate depends on crystal plane orientation, a bipolar transistor including a collector layer, a base layer, and an emitter layer that are epitaxially grown, and a base wire connected to the base layer are arranged. A step is provided at an edge of the base layer, and the base wire is extended from inside to outside of the base layer in a direction intersecting the first direction in a plan view. An intersection of the edge of the base layer and the base wire has a disconnection prevention structure that makes it difficult for step-caused disconnection of the base wire to occur.

14 Claims, 17 Drawing Sheets

(51) Int. Cl.
    *H01L 27/06*     (2006.01)
    *H01L 29/417*     (2006.01)
    *H01L 29/06*     (2006.01)
    *H01L 29/423*     (2006.01)
    *H01L 21/8252*     (2006.01)
    *H01L 29/66*     (2006.01)

(56) References Cited

U.S. PATENT DOCUMENTS

| | | |
|---|---|---|
| 2015/0035121 A1 | 2/2015 | Sasaki |
| 2016/0204235 A1* | 7/2016 | Sasaki ............... H01L 21/30612 257/566 |
| 2017/0186671 A1 | 6/2017 | Sasaki |

FOREIGN PATENT DOCUMENTS

| | | |
|---|---|---|
| JP | 2015-32623 A | 2/2015 |
| TW | 201505175 A | 2/2015 |

* cited by examiner

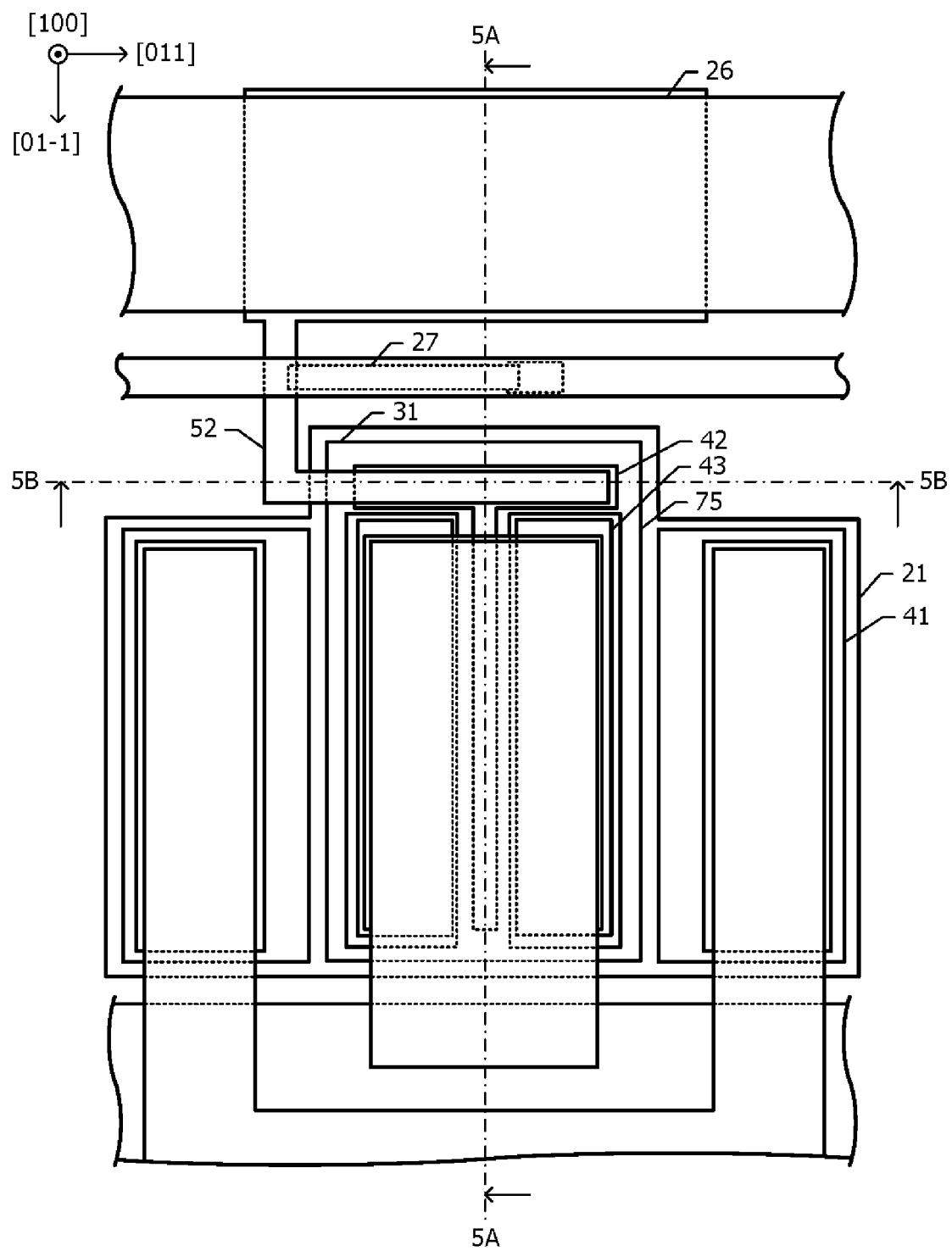

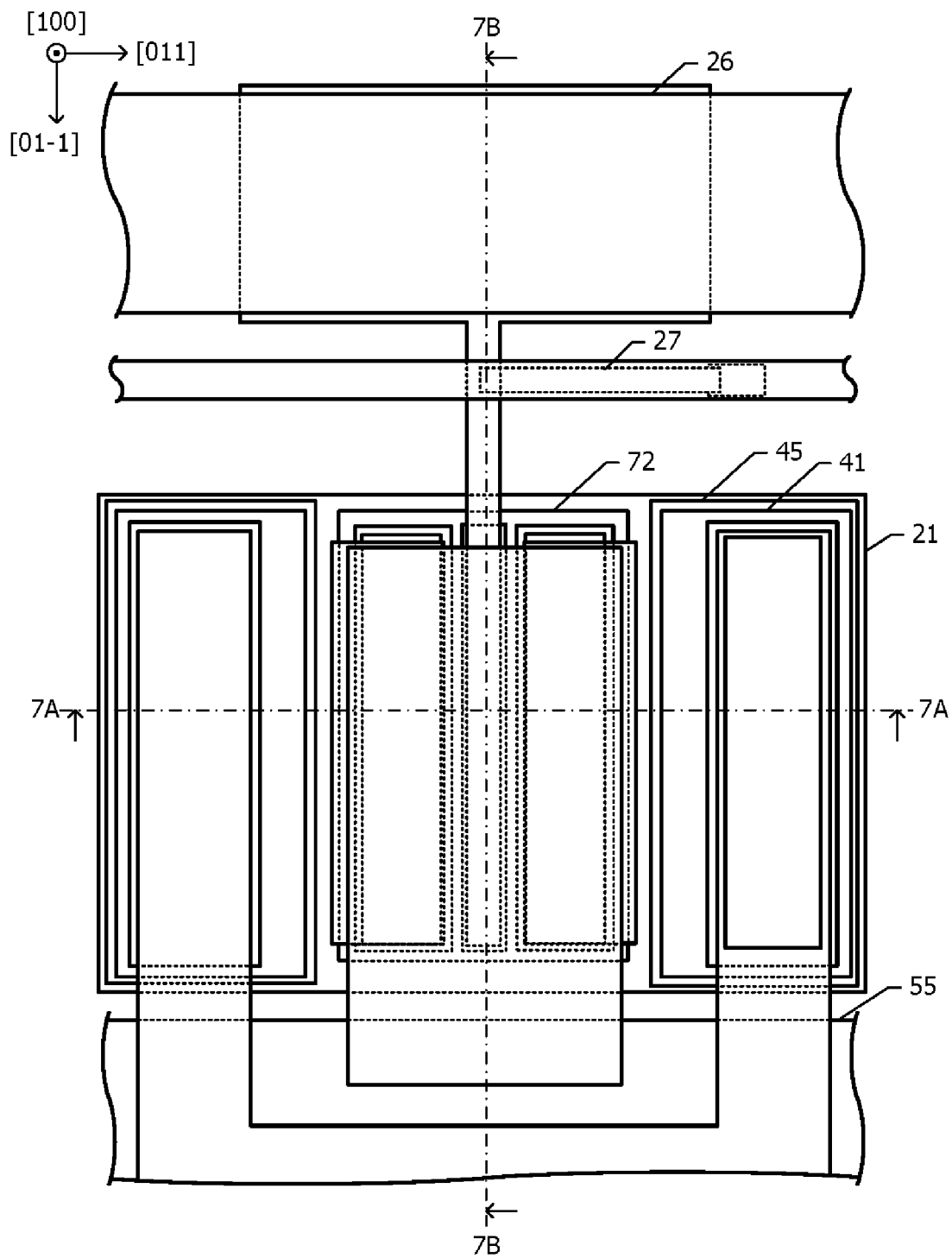

BIPOLAR TRANSISTOR SEMICONDUCTOR DEVICE

This application claims priority from Japanese Patent Application No. 2017-154054 filed on Aug. 9, 2017. The content of this application is incorporated herein by reference in its entirety.

BACKGROUND OF THE DISCLOSURE

Field of the Disclosure

The present disclosure relates to a semiconductor device.

Description of the Related Art

Patent Document 1 below discloses a transistor circuit in which a base ballast resistor is inserted at the base of a hetero-bipolar transistor (HBT), and a capacitor is provided in parallel with the base ballast resistor. The base ballast resistor prevents an increase in base current. The capacitor connected in parallel with the base ballast resistor improves the gain of a radio-frequency (RF) signal. In this transistor circuit, a base layer in a mesa portion including a collector layer, the base layer, and an emitter layer of the HBT is connected by a base finger (base wire) to a mesa portion constituting the capacitor connected in parallel with the base ballast resistor.

Patent Document 2 below discloses a hetero-bipolar transistor including a base layer and an emitter layer provided on a collector mesa on a substrate. A first edge extending in a first direction of the collector mesa has a forward mesa surface, and a second edge extending in a second direction orthogonal to the first direction has an inverted mesa surface. A pair of collector electrodes are arranged at a position sandwiching the collector mesa in the first direction. An emitter electrode and a pair of base electrodes are arranged on the collector mesa, and the pair of base electrodes are arranged at a position sandwiching the emitter electrode in the first direction. A base conductive layer connected to the base electrodes extends across the first edge of the collector mesa. Because the first edge has the forward mesa surface, yield reduction caused by the disconnection of the base conductive layer can be suppressed.

Patent Document 3 below discloses an HBT including a collector layer having a rectangular planar shape, and a base layer and an emitter layer that are formed on the collector layer. An inverted mesa surface is formed at an edge parallel to the transverse direction of the collector layer, and a forward mesa surface is formed at an edge parallel to the longitudinal direction. A base wire is extended to the outside across the edge extending in the longitudinal direction of the collector layer. Because the forward mesa surface is formed at the edge extending in the longitudinal direction of the collector layer, yield reduction caused by the disconnection of the base wire can be suppressed.

Patent Document 1: Japanese Unexamined Patent Application Publication No. 2006-114698
Patent Document 2: Japanese Unexamined Patent Application Publication No. 2004-363322
Patent Document 3: Japanese Unexamined Patent Application Publication No. 2015-032623

BRIEF SUMMARY OF THE DISCLOSURE

Because a base wire is provided so as to cross an edge of a base layer having a forward mesa surface in a conventional semiconductor device, the direction in which the base wire is extended from the base layer to the outside is limited. Therefore, the layout of an HBT and other circuit elements connected to the base of the HBT is restricted. It is an object of the present disclosure to provide a semiconductor device that can enhance the degree of freedom in the layout of a bipolar transistor and circuit elements.

A semiconductor device according to a first aspect of the present disclosure includes:

a single-crystal semiconductor substrate with an upper surface including a first direction in which an inverted mesa step extends and a second direction in which a forward mesa step extends in response to anisotropic etching in which an etching rate depends on crystal plane orientation;

a first bipolar transistor including a first collector layer, a first base layer, and a first emitter layer that are epitaxially grown on the semiconductor layer; and a first base wire connected to the first base layer, wherein:

a step is provided at an edge of the first base layer, the first base wire is extended from inside to outside of the first base layer in a direction intersecting the first direction in a plan view, and an intersection of the edge of the first base layer and the first base wire has a disconnection prevention structure that makes it difficult for step-caused disconnection of the first base wire to occur, compared with a structure in which an inverted mesa step formed by anisotropic etching of the first base layer and the first collector layer intersects the first base layer.

At the intersection of the edge of the first base layer and the first base wire, it becomes difficult for disconnection of the first base wire to occur. Therefore, a circuit element arranged in a direction intersecting the first direction with respect to the first bipolar transistor can be linearly connected to the first bipolar transistor by the first base wire. In addition, because a circuit element connected to the base can be arranged at a position shifted in a direction intersecting the first direction with respect to the first bipolar transistor, the degree of freedom in layout is enhanced.

A semiconductor device according to a second aspect of the present disclosure further includes, in addition to the configuration of the semiconductor device according to the first aspect, a sub-collector layer provided between the semiconductor substrate and the first collector layer, the sub-collector layer having a higher dopant concentration than that of the first collector layer, wherein:

a step with a height reaching the sub-collector layer is provided at an edge of the first collector layer, a first collector electrode ohmic-connected to the sub-collector layer outside the first collector layer is formed, a circuit element arranged on the first collector layer outside the first base layer and connected to the first base wire is formed, the first collector layer spreading outside the first base layer, an inverted mesa step is formed at an edge extending in the first direction of the first collector layer, and a step formed at an edge extending in the first direction of the first base layer is made perpendicular to the upper surface of the semiconductor substrate or made into a forward mesa step, thereby configuring the disconnection prevention structure.

Because the circuit element is arranged on the first collector layer, the first base wire connecting the first bipolar transistor and the circuit element does not intersect the edge of the first collector layer. Therefore, even when an inverted mesa step is formed at an edge extending in the first direction of the first collector layer, no disconnection of the first base wire is caused by this step.

A semiconductor device according to a third aspect of the present disclosure further includes, in addition to the configuration of the semiconductor device according to the second aspect, a first base electrode ohmic-connected to the first base layer, wherein:

the first base wire includes a straight-line portion that extends linearly from the edge of the first base layer to the inside of the first base layer in a plan view, the first base electrode includes a straight-line portion that overlaps the straight-line portion of the first base wire, the straight-line portion of the first base wire is connected to the straight-line portion of the first base electrode, and semiconductor portions each constituting the first emitter layer are arranged on both sides of the first base electrode.

Regarding the straight-line portion of the first base electrode, a pair of semiconductor portions each constituting the first emitter layer can be symmetrically arranged. Therefore, unevenness of current flowing through the emitter layers that are on the left and right of the first base electrode can be reduced.

In a semiconductor device according to a fourth aspect of the present disclosure, in addition to the configuration of the semiconductor device according to the first to third aspects, a dimension in a height direction of the step provided at the edge of the first base layer is smaller than a dimension in a thickness direction of the first base wire.

The advantageous effect that it becomes more difficult for disconnection of the first base layer to occur is achieved.

In a semiconductor device according to a fifth aspect of the present disclosure, in addition to the configuration of the semiconductor device according to the first aspect, the step provided at the edge of the first base layer has a height reaching a bottom surface of the first collector layer, the edge of the first base layer extends in the first direction from the intersection of the edge of the first base layer and the first base wire, the edge of the first base layer extends in a direction shifted from the first direction at a place where the edge of the first base layer and the first base wire overlap each other, and the step provided at the edge of the first base layer is an inverted mesa step on both sides of the first base wire, and is perpendicular or is made into a forward mesa step at a position overlapping the first base wire, thereby configuring the disconnection prevention structure.

Because a step formed at a place overlapping the first base wire is perpendicular or a forward mesa step, the advantageous effect that it is difficult for disconnection of the first base wire to occur is achieved.

A semiconductor device according to a sixth aspect of the present disclosure further includes, in addition to the configuration of the semiconductor device according to the fifth aspect, a first base electrode arranged on the first base layer and having a linear shape extending in the second direction, wherein:

semiconductor portions each constituting the first emitter layer are arranged on both sides of the first base electrode, the first base electrode extends to outside an area where the first emitter layers are arranged regarding the second direction, and includes a widened portion that becomes wider in an inverted tapered shape as the widened portion extends farther away from the first emitter layers in the second direction, and the first base wire is connected to the widened portion of the first base electrode.

When the width of the first base electrode becomes discontinuously and suddenly wide, a corner portion of each of the first emitter layers is arranged in a narrow angle of about 90° defined by an edge of a narrow portion and an edge of a wide portion. With such a configuration, current tends to be concentrated in the corner portion of each of the first emitter layers, thereby lowering the breakdown tolerance. By making the widened portion a tapered shape, the concentration of current can be alleviated, and a decrease in breakdown tolerance can be suppressed.

A semiconductor device according to a seventh aspect of the present disclosure further includes, in addition to the configuration of the semiconductor device according to the first to sixth aspects, a second bipolar transistor including a second collector layer, a second base layer, and a second emitter layer that are epitaxially grown on the semiconductor layer; and a second base wire connected to the second base layer, wherein:

a step is provided at an edge of the second base layer, and the second base wire is extended from inside to outside of the second base layer so as to intersect an edge extending in the second direction of the second base layer in a plan view.

Because a forward mesa step is formed at an edge extending in the second direction of the second base layer, the disconnection of the second base wire is unlikely to occur. A direction in which the first base wire is extended and a direction in which the second base wire is extended intersect each other. Two types of bipolar transistors whose base wires are extended in directions orthogonal to each other can be formed on one common semiconductor substrate. In this way, the degree of freedom in layout taking into consideration the in-plane direction of bipolar transistors can be enhanced.

At the intersection of the edge of the first base layer and the first base wire, it becomes difficult for disconnection of the first base wire to occur. Therefore, a circuit element arranged in a direction intersecting the first direction with respect to the first bipolar transistor can be linearly connected to the first bipolar transistor by the first base wire. In addition, because a circuit element connected to the base can be arranged at a position shifted in a direction intersecting the first direction with respect to the first bipolar transistor, the degree of freedom in layout is enhanced.

BRIEF DESCRIPTION OF THE SEVERAL VIEWS OF THE DRAWINGS

FIG. 4 is a plan view of a semiconductor device according to a reference example.

FIG. 6 is a plan view of a semiconductor device according to a third embodiment.

DETAILED DESCRIPTION OF THE DISCLOSURE

First Embodiment

Figure 1A:
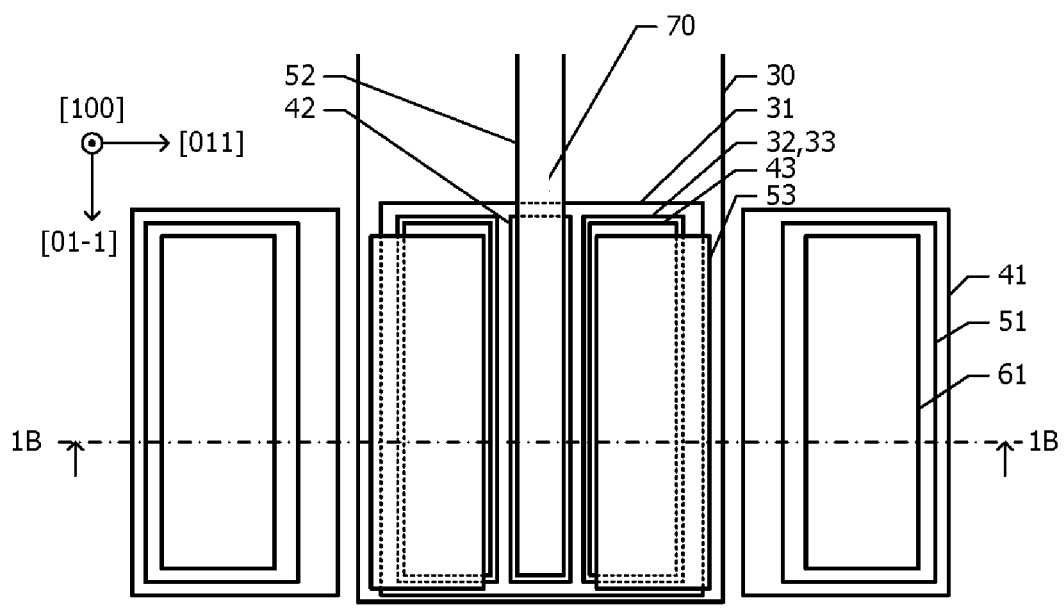
FIG. 1A is a plan view of an HBT according to a first embodiment.
Figure 1B:
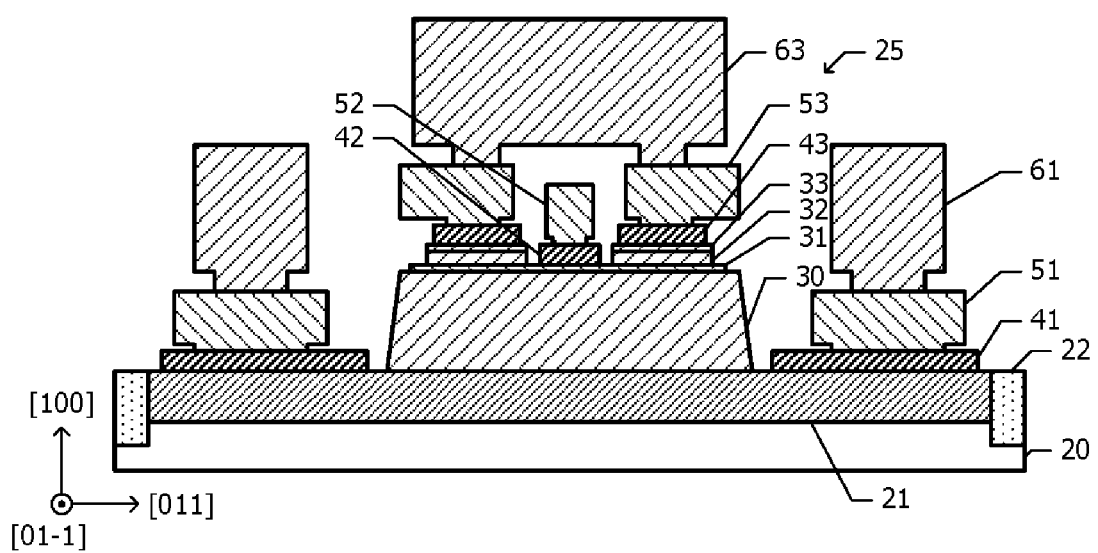
FIG. 1B is a sectional view taken along the dash-dotted line 1B-1B in FIG. 1A.

Referring to FIGS. 1A and 1B, a semiconductor device according to a first embodiment will be described by using a heterojunction bipolar transistor (HBT) by way of example.

FIG. 1A is a plan view of an HBT according to the first embodiment, and FIG. 1B is a sectional view taken along the dash-dotted line 1B-1B in FIG. 1A. An HBT 25 is formed on a semi-insulating single-crystal semiconductor substrate 20. A substrate with the following characteristics is used as the semiconductor substrate 20: the characteristics are such that an inverted mesa step extends in a first direction of an upper surface and a forward mesa step extends in a second direction in response to mesa etching using anisotropic etching in which the etching rate depends on crystal plane orientation. Here, the term "inverted mesa step" refers to a step having a side inclined so that the normal direction faces downward (substrate side). The term "forward mesa step" refers to a step having a side inclined so that the normal direction faces upward.

When a (100) GaAs substrate is used as the semiconductor substrate 20, an inverted mesa step extends in the [011] direction, and a forward mesa step extends in the [01-1] direction. Here, an element to be added a Miller exponent overbar indicating a direction in a single crystal is represented with a minus sign. The [011] direction corresponds to a first direction, and the [01-1] direction corresponds to a second direction.

A conductive sub-collector layer 21 is epitaxially grown on the semiconductor substrate 20. An insulating area 22 is formed by implanting insulating ions in a partial area of the sub-collector layer 21. The insulating area 22 partitions the sub-collector layer 21 into a plurality of conductive areas. Hereinafter, only the conductive areas may be referred to as the sub-collector layer 21.

A collector layer 30, a base layer 31, and emitter layers 32 are epitaxially grown on the sub-collector layer 21, and these layers are mesa-etched into certain shapes. For example, the collector layer 30 is formed of n-type GaAs, the base layer 31 is formed of p-type GaAs, and the emitter layers 32 are formed of n-type InGaP. A dopant is doped into the sub-collector layer 2 at a higher concentration than that of the collector layer 30. Emitter contact layers 33 are arranged on the emitter layers 32. The emitter contact layers 33 have a two-layer structure composed of, for example, a layer made of n-type GaAs and a layer made of n-type InGaAs.

A pair of conductor portions constituting collector electrodes 41 is arranged at a position sandwiching the collector layer 30 in the [011] direction. The emitter layers 32 are arranged on the base layer 31, and are composed of a pair of semiconductor portions spaced apart from each other in the [011] directions. A base electrode 42 is arranged between the pair of semiconductor portions constituting the emitter layers 32. Emitter electrodes 43 are arranged on the emitter contact layers 33. The collector electrodes 41, the base electrode 42, and the emitter electrodes 43 are ohmic-connected to the sub-collector layer 21, the base layer 31, and the emitter contact layers 33, respectively.

First-layer collector wires 51, a first-layer base wire 52, and first-layer emitter wires 53 are arranged on the collector electrodes 41, the base electrode 42, and the emitter electrodes 43, respectively. Second-layer collector wires 61 are arranged on the first-layer collector wires 51. A second-layer emitter wire 63 is arranged on the first-layer emitter wires 53. The second-layer emitter wire 63 passes through an upper portion of the base wire 52 in the [011] direction and connects the pair of semiconductor portions constituting the emitter layers 32 to each other with the emitter wires 53 interposed therebetween.

Steps are provided at edges of the base layer 31, and steps are also provided at edges of the collector layer 30. Inverted mesa steps are formed at edges extending in the [011] direction of the collector layer 30, and forward mesa steps are formed at edges extending in the [01-1] direction of the collector layer 30.

The base wire 52 is extended from inside to outside of the base layer 31 in a direction intersecting the [011] direction, such as [0-11] direction (upward in FIG. 1A), in a plan view. A disconnection prevention structure 70 for preventing step-caused disconnection of the base wire 52 is provided at a place where the base wire 52 and an edge of the base layer 31 intersect.

Next, various specific examples of the disconnection prevention structure 70 will be described.

In a first specific example, a collector mesa including the collector layer 30 is additionally arranged outside the base layer 31. Dry etching in which the etching rate is independent of crystal plane orientation is used in etching from the base layer 31 to the upper surface of the collector mesa. Accordingly, a step formed at an edge extending in the [011] direction of the base layer 31 does not become an inverted mesa step, but becomes substantially perpendicular with respect to the upper surface of the semiconductor substrate 20 or a forward mesa step. Therefore, the disconnection of the base wire 52 crossing this edge is less likely to occur.

In a second example, out of an edge extending in the [011] direction of the base layer 31, a portion that overlaps with the base wire 52 is formed to be shifted from the [011] direction so that an inverted mesa step will not be formed.

For example, out of an edge extending in the [011] direction of the base layer 31, a portion that overlaps with the base wire 52 is locally made parallel with the [010] direction or the [001] direction.

In the first embodiment, even in the case where the base wire 52 is arranged so as to intersect with an edge extending in a direction in which an inverted mesa step is formed, yield reduction caused by disconnection of the base wire 52 can be suppressed by having the disconnection prevention structure 70 at the intersection.

Second Embodiment

Next, referring to FIGS. 2A, 2B, 3A, and 3B, a semiconductor device according to a second embodiment will be described. In the second embodiment, the disconnection prevention structure 70 (FIG. 1A) of the semiconductor device according to the first embodiment will be more specifically illustrated. Hereinafter, descriptions of configurations that are common to those of the semiconductor device according to the first embodiment will be omitted.

Figure 2A:
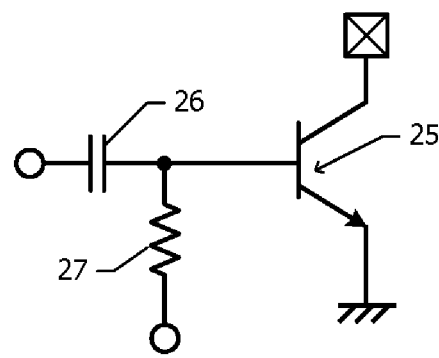
FIG. 2A is an equivalent circuit diagram of a semiconductor device according to a second embodiment.

FIG. 2A is an equivalent circuit diagram of the semiconductor device according to the second embodiment. The semiconductor device according to the second embodiment includes the HBT 25, an input capacitor 26, and a ballast resistor 27. An RF input signal is inputted to the base of the HBT 25 via the input capacitor 26. A bias current is supplied to the base of the HBT 25 via the ballast resistor 27. A collector voltage Vcc is applied to the collector of the HBT 25, and the emitter of the HBT 25 is grounded.

Figure 2B:
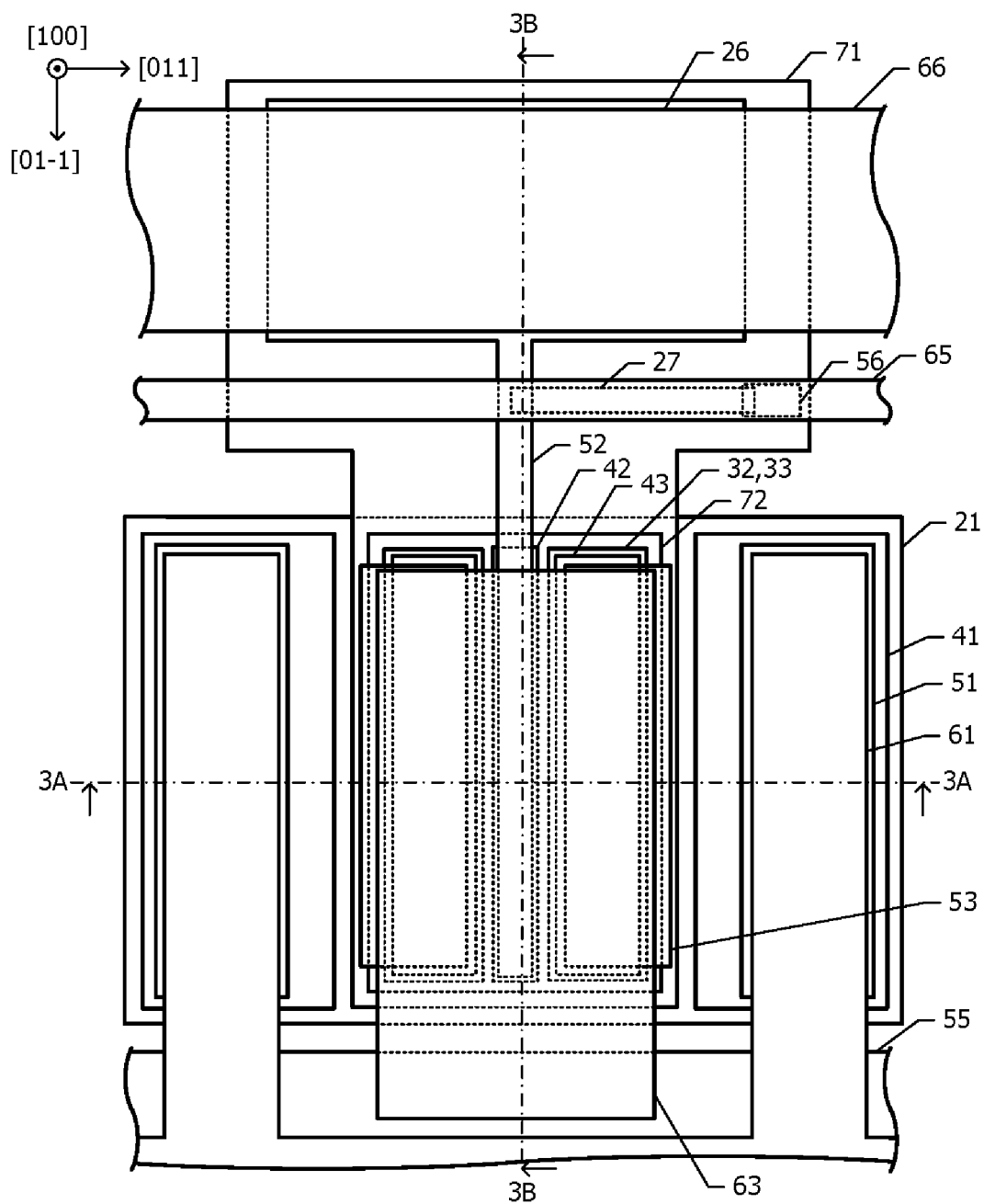
FIG. 2B is a plan view of the semiconductor device according to the second embodiment.
Figure 3A:
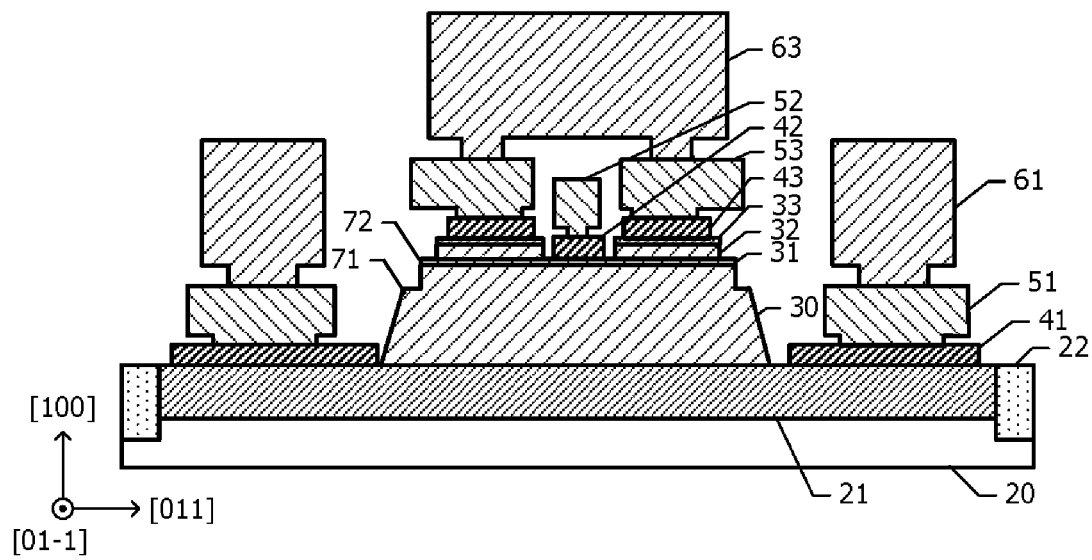
FIGS. 3A and 3B are sectional views taken along the dash-dotted lines 3A-3A and 3B-3B, respectively, in FIG. 2B.
Figure 3B:
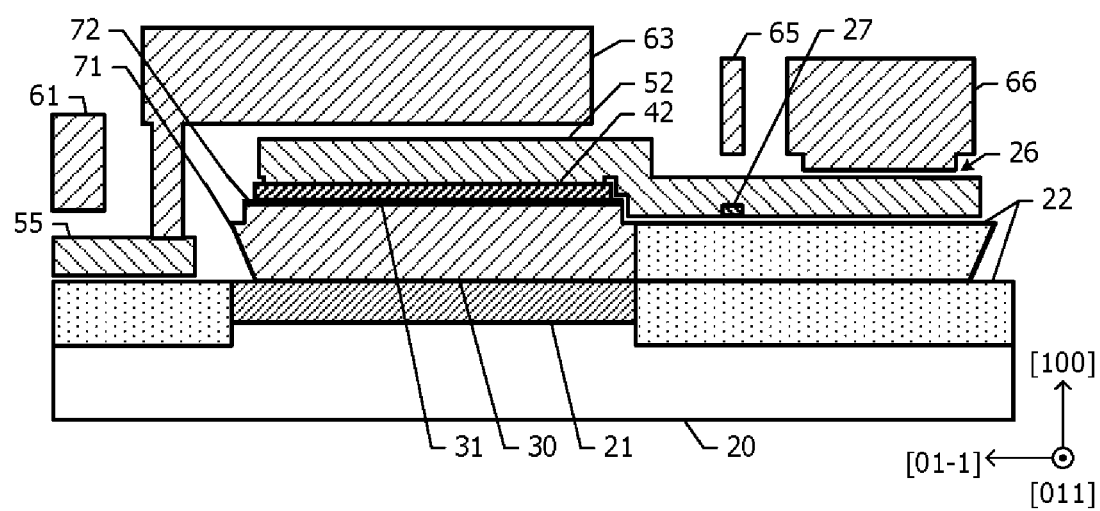

FIG. 2B is a plan view of the semiconductor device according to the second embodiment. FIGS. 3A and 3B are sectional views taken along the dash-dotted lines 3A-3A and 3B-3B, respectively, in FIG. 2B. The following description will be given with reference to FIGS. 2B, 3A, and 3B. In the sectional views illustrated in FIGS. 3A and 3B, an inter-layer insulating film is not clearly illustrated but is simply illustrated as a gap. In the plan view illustrated in FIG. 2B, a contact hole provided in an inter-layer insulating film is not indicated.

The n+ type sub-collector layer 21 is formed on the semi-insulating semiconductor substrate 20. The insulating area 22 partitions the sub-collector layer 21 into a plurality of conductive areas. A second mesa-portion 72 is formed by mesa-etching the base layer 31 and a surface portion of the collector layer 30. A first mesa portion 71 is formed by mesa-etching a lower layer portion of the collector layer 30. A two-level mesa structure including the lower-level first mesa portion 71 and the upper-level second mesa portion 72 is formed by the collector layer 30 and the base layer 31. In a plan view, the collector layer 30 outside the second mesa portion 72 is made into the insulating area 22 by implanting insulating ions.

Dry etching in which the etching rate is independent of crystal plane orientation is applied to mesa-etching for forming the second mesa portion 72. Therefore, a step formed at each edge of the second mesa portion 72 is composed of a side that stands substantially perpendicularly. Wet etching in which the etching rate depends on crystal plane orientation is applied to mesa-etching for forming the first mesa portion 71. Therefore, inverted mesa steps (FIG. 3B) are formed at edges extending in the [011] direction, and forward mesa steps (FIG. 3A) are formed at edges extending in the [01-1] direction of the first mesa portion 71.

The configuration of the emitter layers 32, the emitter contact layers 33, the base electrode 42, the emitter electrodes 43, the base wire 52, the emitter wires 53, and the emitter wire 63 arranged on the base layer 31 is the same as the configuration of these elements of the semiconductor device according to the first embodiment. The configuration of the collector electrodes 41, the first-layer collector wires 51, and the second-layer collector wires 61 arranged on the sub-collector layer 21 is the same as the configuration of these elements of the semiconductor device according to the first embodiment.

The second-layer emitter wire 63 is extended in the [01-1] direction to the outside of the first mesa portion 71 in a plan view, and is connected to a first-layer metal wire 55 arranged on the insulating area 22. The paired second-layer collector wires 61 are extended from the conductive sub-collector layer 21 to the external insulating area 22 in a plan view, and are connected to each other above the insulating area 22.

The base wire 52 is extended from inside to outside of the base layer 31 in the [0-11] direction so as to intersect with an edge of the second mesa portion 72, that is, an edge of the base layer 31, in a plan view. That is, the base wire 52 is extended in a direction intersecting a direction (the [011] direction) in which an inverted mesa step extends in response to anisotropic etching. The base wire 52 extended to the outside of the base layer 31 is arranged on the upper surface of the first mesa portion 71 with an inter-layer insulating film interposed therebetween. Note that the collector layer 30 below the base wire 52 extended to the outside of the base layer 31 is made into the insulating area 22.

In addition, the base wire 52 includes a straight-line portion that extends linearly from an edge of the base layer 31 to the inside of the base layer 31. This straight-line portion is arranged immediately above the base electrode 42, and is connected to the base electrode 42 via the interior of a contact hole of the inter-layer insulating film.

The base wire 52 extended to the outside of the base layer 31 intersects with second-layer wire metals 65 and 66 above the first mesa portion 71. The ballast resistor 27 is arranged at the intersection of the base wire 52 and the second-layer wire metal 65, and the input capacitor 26 is arranged at the intersection of the base wire 52 and the second-layer metal wire 66.

The ballast resistor 27 includes a high-resistance wire made of a high-resistance material formed on the upper surface of the inter-layer insulating film below the base wire 52. One of two ends of the high-resistance wire is connected to the base wire 52, and the other end is connected to the second-layer metal wire 65 with a first-layer metal pattern 56 interposed therebetween.

The input capacitor 26 includes part of the base wire 52, part of the second-layer metal wire 66, and an inter-layer insulating film between the two. A portion of the base wire 52 that constitutes the input capacitor 26 is made wider in the [011] direction than the other portion. By making the base wire 52 wider, an area where the base wire 52 and the metal wire 66 overlap with each other becomes larger in area, and sufficient electrostatic capacitance can be ensured.

Next, excellent advantageous effects of the semiconductor device according to the second embodiment will be described.

Circuit elements such as the input capacitor 26 and the ballast resistor 27 connected to the base wire 52 are arranged outside the second mesa portion 72 but inside the first mesa portion 71 in a plan view. Therefore, the base wire 52 connecting the base electrode 42 of the HBT 25 and the circuit elements intersects with an edge extending in the [011] direction of the base layer 31, but does not intersect with an edge of the first mesa portion 71 where an inverted mesa step is generated. A step formed at each edge of the second mesa portion 72 that the base wire 52 intersects is composed of a substantially perpendicular side.

Furthermore, compared with a configuration in which the collector layer 30 in an area where the circuit elements are arranged is removed and the circuit elements are arranged on the insulating area 22 of the sub-collector layer 21 with an inter-layer insulating film interposed therebetween, a step that the base wire 52 intersects becomes lower in height. For example, it is preferable that the height of a step formed at each edge of the second mesa portion 72 be greater than the thickness of the base layer 31 and less than or equal to 0.7 μm, and that the thickness of the base wire 52 be greater than or equal to 0.8 μm and less than or equal to 1.5 μm.

Yield reduction caused by disconnection of the base wire 52 can be suppressed by making the shape and height of each step as the above-described configuration. To make disconnection of the base wire 52 less likely to occur, it is preferable to make the dimension in the height direction of a step formed at each edge of the second mesa portion 72 less than the dimension in the height direction of the base wire 52. In addition, because the base wire 52 can be extended in a direction that intersects with an edge where an inverted mesa step is formed, the degree of freedom in the layout of the HBT 25 relative to crystal axis orientation within the upper surface of the semiconductor substrate 20 can be increased.

In response to mesa etching using only dry etching of both the base layer 31 and the collector layer 30 up to the upper surface of the sub-collector layer 21, perpendicular steps become larger, and it becomes difficult to extend the base wire 52. In the second embodiment, dry etching is applied to mesa etching from the base layer 31 to the surface portion of the collector layer 30, and wet etching is applied to mesa etching of the lower layer portion of the collector layer 30. Therefore, perpendicular and large steps can be alleviated, compared with the case of dry etching of both the base layer 31 and the collector layer 30 up to the upper surface of the sub-collector layer 21. As a result, it becomes easier to extend the base wire 52.

Figure 5A:
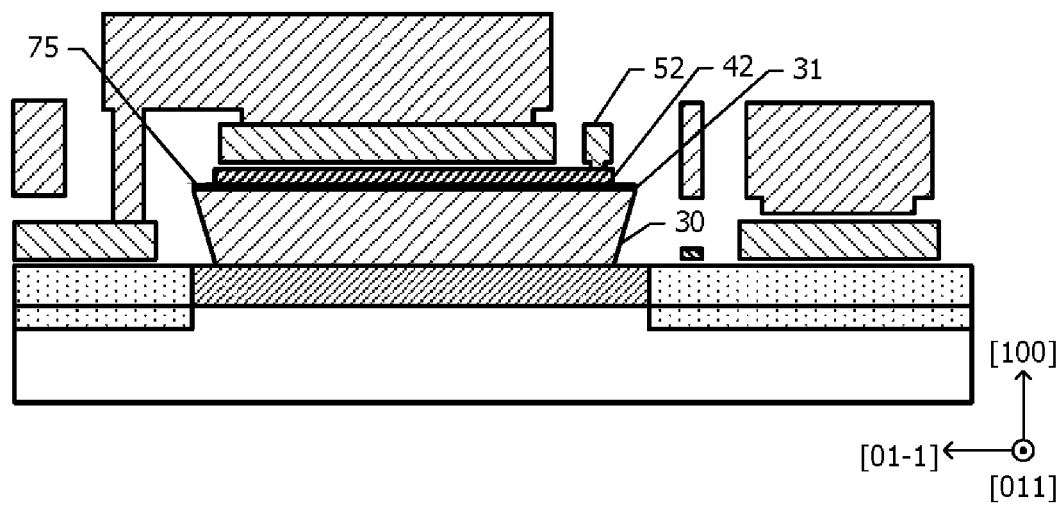
FIGS. 5A and 5B are sectional views taken along the dash-dotted lines 5A-5A and 5B-5B, respectively, in FIG. 4.
Figure 5B:
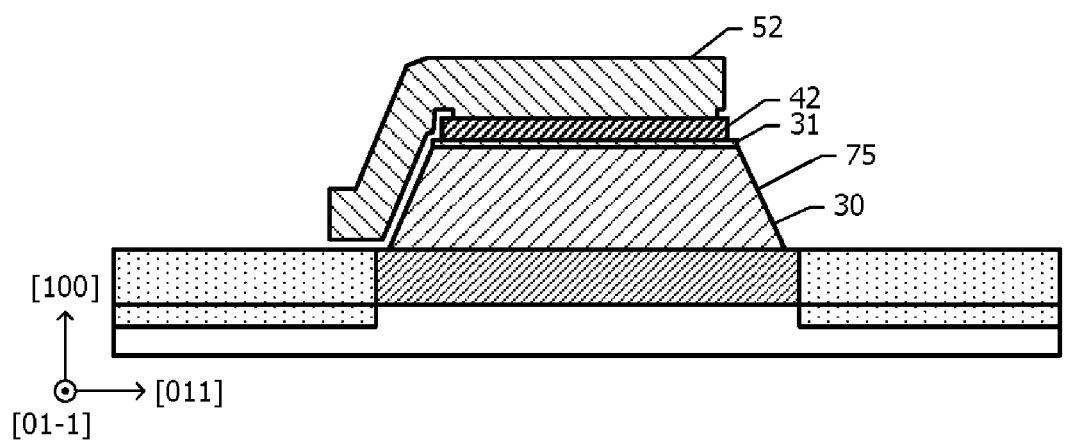

Next, excellent advantageous effects of the semiconductor device according to the second embodiment will be described in comparison with a reference example illustrated in FIGS. 4, 5A, and 5B.

FIG. 4 is a plan view of a semiconductor device according to the reference example. FIGS. 5A and 5B are sectional views taken along the dash-dotted lines 5A-5A and 5B-5B, respectively, in FIG. 4. In the second embodiment, the two-level structure of the first mesa portion 71 and the second mesa portion 72 (FIG. 3A) is formed by two layers, the collector layer 30 and the base layer 31. In the reference example, a one-level mesa portion 75 is formed by two layers, the collector layer 30 and the base layer 31.

In the second embodiment, the base electrode 42 has a linear shape extending in the [01-1] direction. In the reference example, the base electrode 42 has a T-shaped planar shape including a linear shape portion (an extended portion) extending in the [011] direction and a linear shape portion (a main portion) extending in the [01-1] direction from the middle point of the extended portion. The base wire 52 is connected to the extended portion of the base electrode 42 and is extended from inside to outside of the mesa portion 75 in the [0-1-1] direction.

Inverted mesa steps (FIG. 5A) are formed at edges extending in the [011] direction of the mesa portion 75. When the base wire 52 intersects with an edge extending in the [011] direction of the mesa portion 75, the disconnection of the base wire 52 occurs more easily. In the reference example, to suppress the disconnection of the base wire 52, the base wire 52 intersects with an edge extending in the [01-1] direction in which forward mesa steps (FIG. 5B) are formed. That is, the base wire 52 is extended in a direction in which the collector electrodes 41 and the emitter electrodes 43 are aligned.

It is efficient to arrange the ballast resistor 27 and the input capacitor 26 apart from the base electrode 42 in a direction orthogonal to a direction in which the collector electrodes 41 and the emitter electrodes 43 are aligned. With such an arrangement, it is necessary to bend the base wire 52 into an L shape in order to connect the base wire 52 to the ballast resistor 27 and the input capacitor 26. When the base wire 52 is bent into an L shape, the wiring length of the base wire 52 becomes long, resulting in an increase in parasitic resistance.

In contrast, in the second embodiment, it is not necessary to bend the base wire 52 (FIG. 2B), and the base electrode 42 to the ballast resistor 27 and the input capacitor 26 can be linearly connected at the shortest distance. Therefore, an increase in the parasitic resistance of the base wire 52 can be suppressed.

In addition, the base wire 52 is not line symmetric with respect to the main portion of the base electrode 42 in the reference example illustrated in FIG. 4. For example, the distance from the intersection of the base wire 52 and an edge of the base layer 31 to the right end of the extended portion of the base electrode 42 is longer than the distance from the intersection to the left end of the extended portion. Therefore, the parasitic resistance from the intersection of the base wire 52 and an edge of the base layer 31 to the right end of the extended portion of the base electrode 42 is higher than the parasitic resistance from the intersection to the left end of the extended portion. As a result, the distribution of base current flowing through the base layer 31 becomes bilaterally asymmetric.

In contrast, in the second embodiment, the base wire 52 (FIG. 2B) is bilaterally symmetric with respect to the base electrode 42. Therefore, the distribution of base current flowing through the base layer 31 becomes bilaterally symmetric and approaches to be uniform. As a result, a decrease in breakdown tolerance of the HBT 25 can be suppressed.

In the reference example illustrated in FIG. 4, the base wire 52 is connected to the extended portion of the base electrode 42. However, the base wire 52 is not connected to the main portion of the base electrode 42, which is held between the paired semiconductor portions constituting the emitter layers 32. In contrast, in the second embodiment, the base wire 52 is connected to the base electrode 42 (FIG. 3A), which is held between the paired semiconductor portions constituting the emitter layers 32. Therefore, in the second embodiment, the base parasitic resistance of the HBT 25 can be reduced, compared with the reference example illustrated in FIG. 4.

Third Embodiment

Figure 7A:
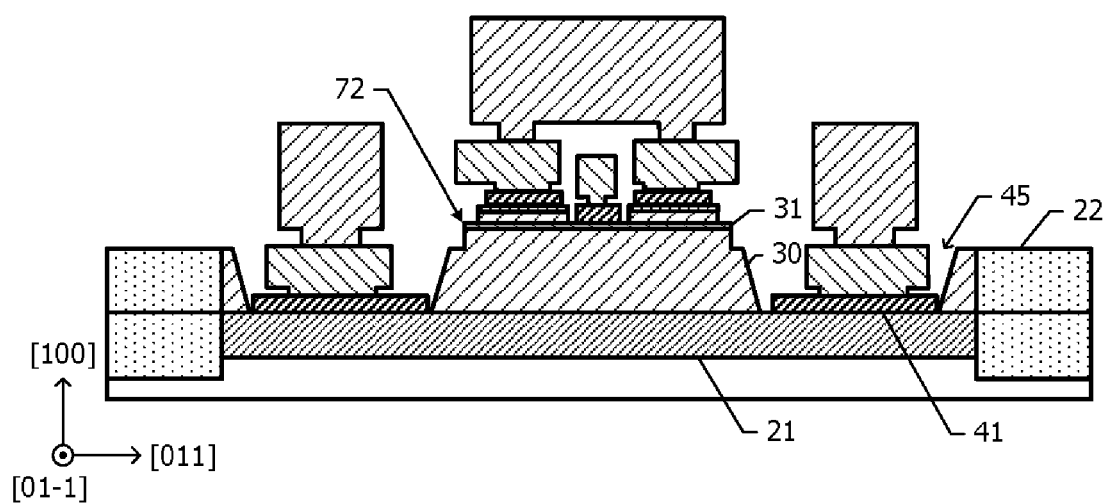
FIGS. 7A and 7B are sectional views taken along the dash-dotted lines 7A-7A and 7B-7B, respectively, in FIG. 6.
Figure 7B:
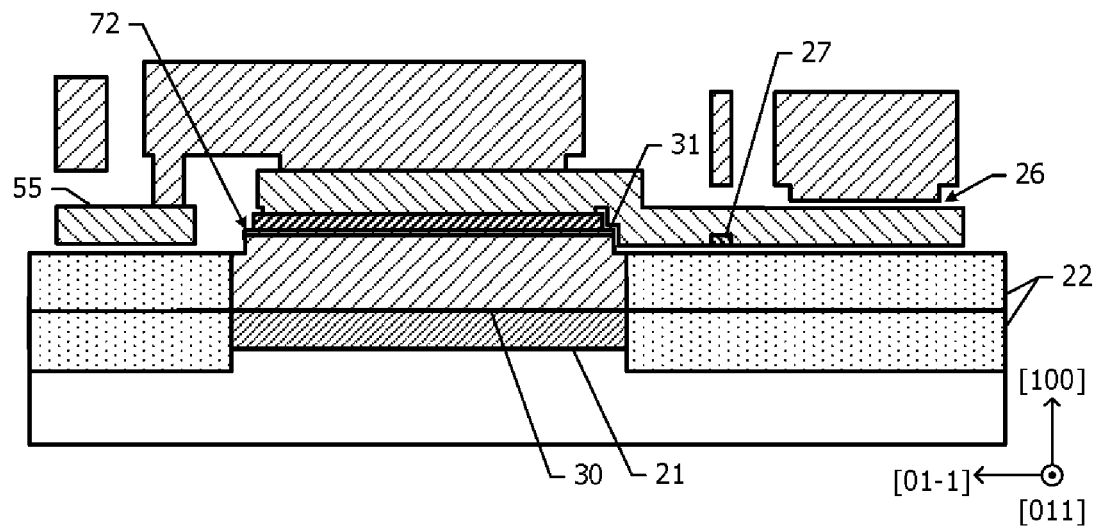

Next, referring to FIGS. 6, 7A, and 7B, a semiconductor device according to a third embodiment will be described. Hereinafter, descriptions of configurations that are common to those of the semiconductor device according to the second embodiment (FIGS. 2A, 2B, 3A, and 3B) will be omitted.

FIG. 6 is a plan view of the semiconductor device according to the third embodiment. FIGS. 7A and 7B are sectional views taken along the dash-dotted lines 7A-7A and 7B-7B, respectively, in FIG. 6. In the second embodiment, the first mesa portion 71 and the second mesa portion 72 (FIG. 3A) are formed by mesa-etching the base layer 31 and the collector layer 30.

The third embodiment is common to the second embodiment in the point that the second mesa portion 72 is formed by mesa-etching the base layer 31 and the surface portion of the collector layer 30. Although the first mesa portion 71 (FIGS. 3A and 3B) is formed by mesa-etching the lower layer portion of the collector layer in the second embodiment, a recess portion 45 reaching the upper surface of the sub-collector layer 21 is formed in an area where the collector electrodes 41 are to be arranged in the third embodiment. Therefore, the collector layer 30 remains in an area that should be insulated. The insulating area 22 is formed by implanting insulating ions into the collector layer 30 which remains in an area that should be insulated and into the sub-collector layer 21.

For example, in the second embodiment, the collector layer 30 is removed outside an area where the collector electrodes 41 are arranged in the cross-section illustrated in FIG. 3A. In contrast, in the third embodiment, as illustrated in FIG. 7A, the collector layer 30 is arranged also outside an area where the collector electrodes 41 are arranged. Furthermore, in the second embodiment, the collector layer 30 is removed in an area where the first-layer metal wire 55 (FIGS. 2B and 3B) is arranged. In contrast, in the third embodiment, the first-layer metal wire 55 (FIG. 7B) is arranged on the collector layer 30 which has been made into the insulating area 22.

In the third embodiment, circuit elements such as the ballast resistor 27 and the input capacitor 26 are also arranged on the collector layer 30. The shape and dimensions of the steps formed at edges of the second mesa portion 72 that the base wire 52 intersects with, which connects these circuit elements and the base electrode 42, are the same as those in the case of the second embodiment. Therefore, excellent advantageous effects that are the same as or similar to those of the first embodiment are achieved also in the second embodiment.

Fourth Embodiment

Next, referring to FIGS. 8 and 9, a semiconductor device according to a fourth embodiment will be described. Hereinafter, descriptions of configurations that are common to those of the semiconductor device according to the second embodiment will be omitted.

Figure 8:
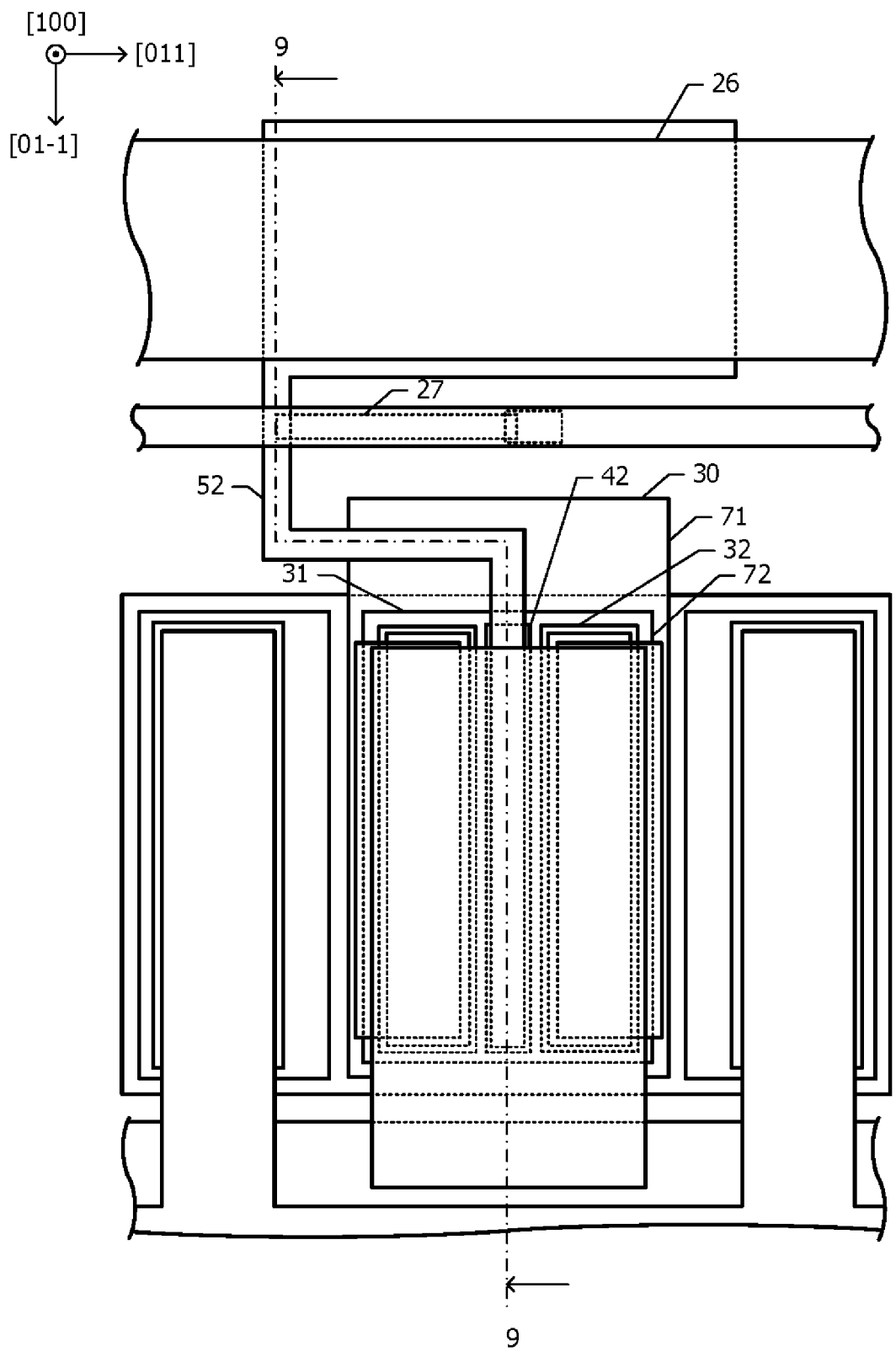
FIG. 8 is a plan view of a semiconductor device according to a fourth embodiment.
Figure 9:
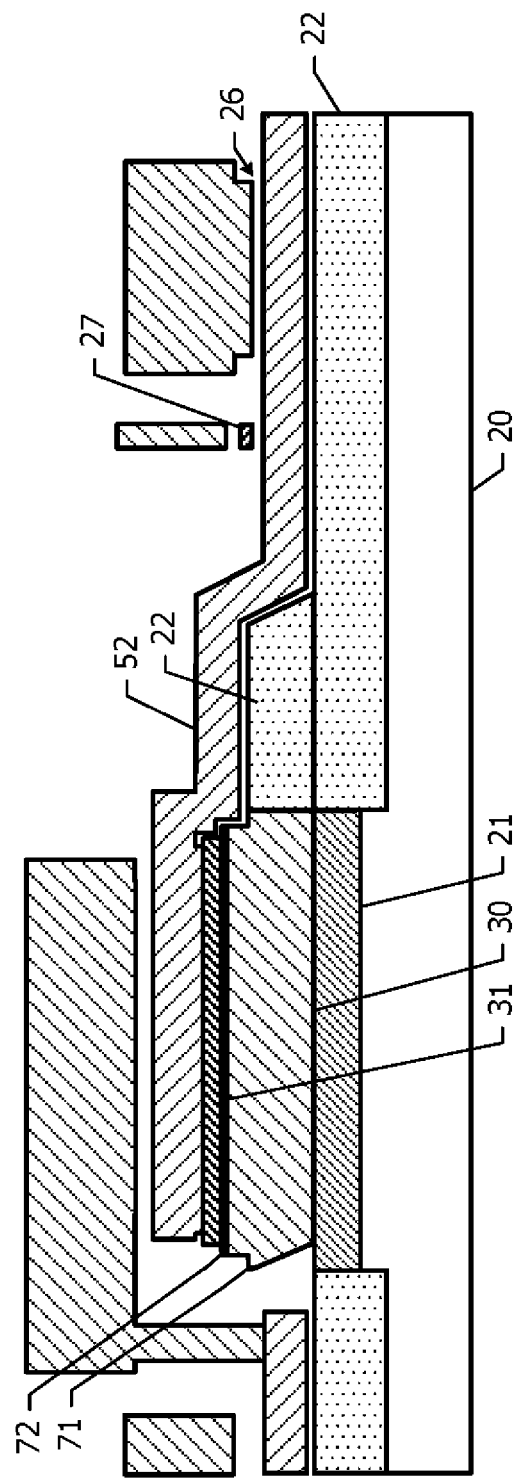
FIG. 9 is a sectional view taken along the dash-dotted line 9-9 in FIG. 8.

FIG. 8 is a plan view of the semiconductor device according to the fourth embodiment. FIG. 9 is a sectional view taken along the dash-dotted line 9-9 in FIG. 8. Although circuit elements such as the ballast resistor 27 and the input capacitor 26 (FIGS. 2B and 3B) are arranged on the first mesa portion 71 in the second embodiment, these circuit elements are arranged outside the first mesa portion 71 in the fourth embodiment. That is, these circuit elements are arranged on the insulating area 22 which is the insulated sub-collector layer 21.

The base wire 52 is extended from inside to outside of the base layer 31 in the [0-11] direction, as in the second embodiment. The base wire 52 extended to the outside of the base layer 31 is bent in the [0-1-1] direction on the first mesa portion 71, intersects with an edge extending in the [01-1] direction of the first mesa portion 71, and is extended to the outside of the first mesa portion 71. The base wire 52 is bent in the [0-11] direction outside the first mesa portion 71, and is connected to the ballast resistor 27 and the input capacitor 26.

Because the base wire 52 intersects with an edge where a forward mesa step of the first mesa portion 71 is formed in the fourth embodiment, the advantageous effect of suppressing the occurrence of the disconnection of the base wire 52 is achieved. In addition, the place where the base wire 52 is bent is outside the base layer 31, and, when attention is paid to the inside of the base layer 31, the relative positional relationship among the base electrode 42, the base wire 52, and the emitter layers 32 is the same as the relative positional relationship among these elements in the second embodiment (FIG. 2B). Therefore, the current distribution does not become bilaterally asymmetric as in the reference example illustrated in FIG. 4, but becomes bilaterally symmetric as in the case of the second embodiment. Therefore, a decrease in breakdown tolerance of the HBT 25 can be suppressed, as in the second embodiment.

Fifth Embodiment

Next, referring to FIGS. 10, 11A, and 11B, a semiconductor device according to a fifth embodiment will be described. Hereinafter, descriptions of configurations that are common to those of the semiconductor device according to the second embodiment (FIGS. 2A, 2B, 3A, and 3B) will be omitted.

Figure 10:
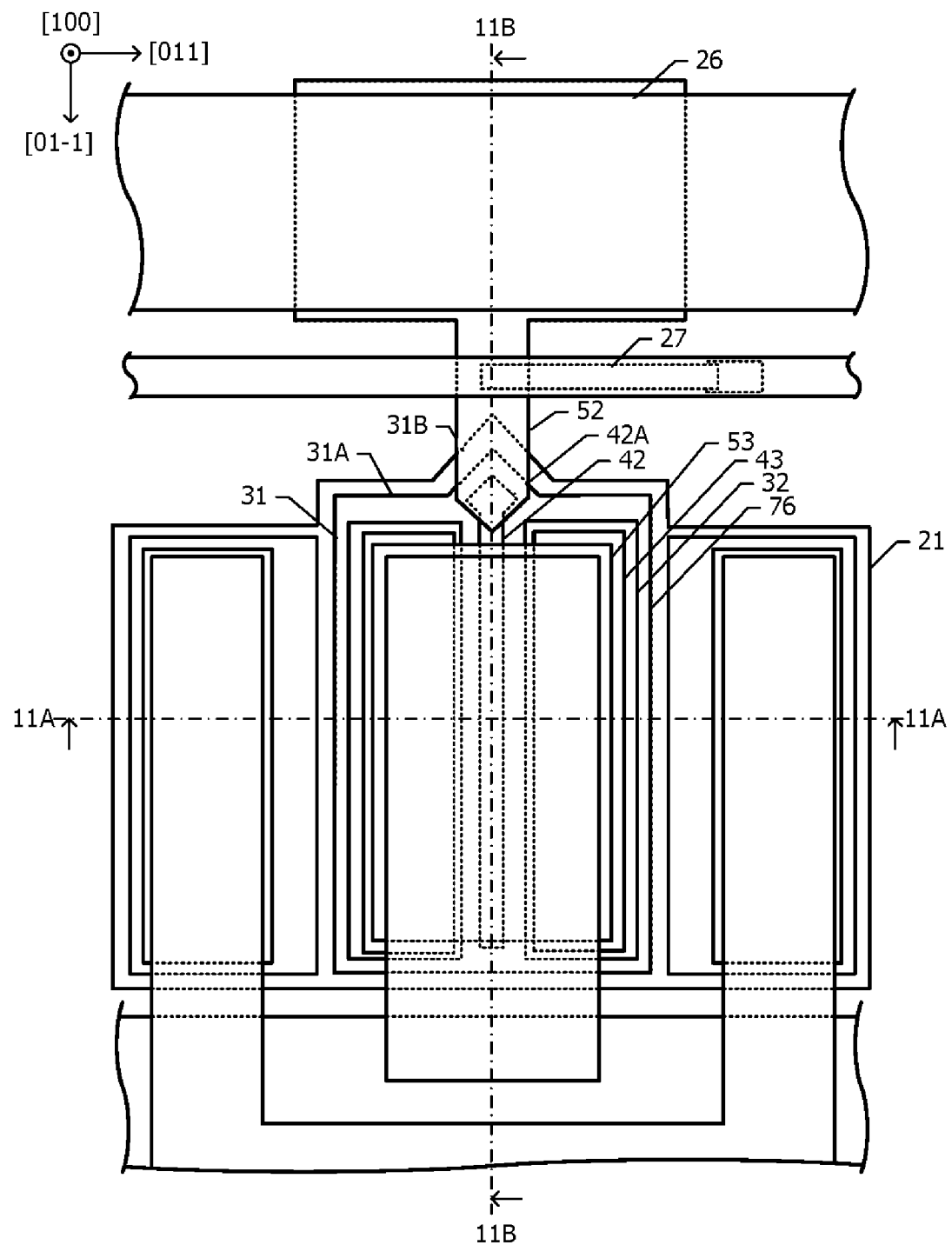
FIG. 10 is a plan view of a semiconductor device according to a fifth embodiment.
Figure 11A:
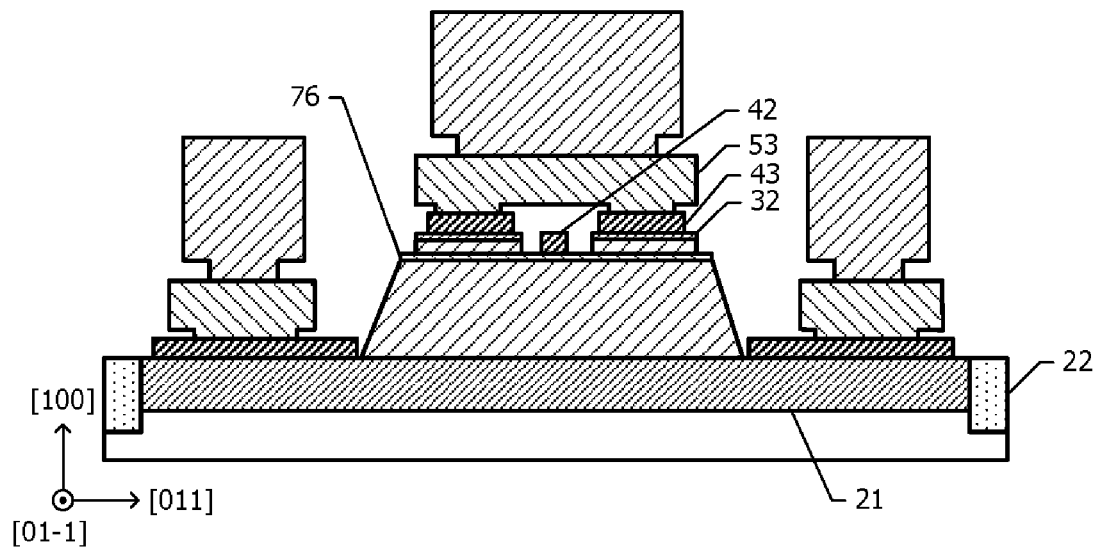
FIGS. 11A and 11B are sectional views taken along the dash-dotted lines 11A-11A and 11B-11B, respectively, in FIG. 10.
Figure 11B:
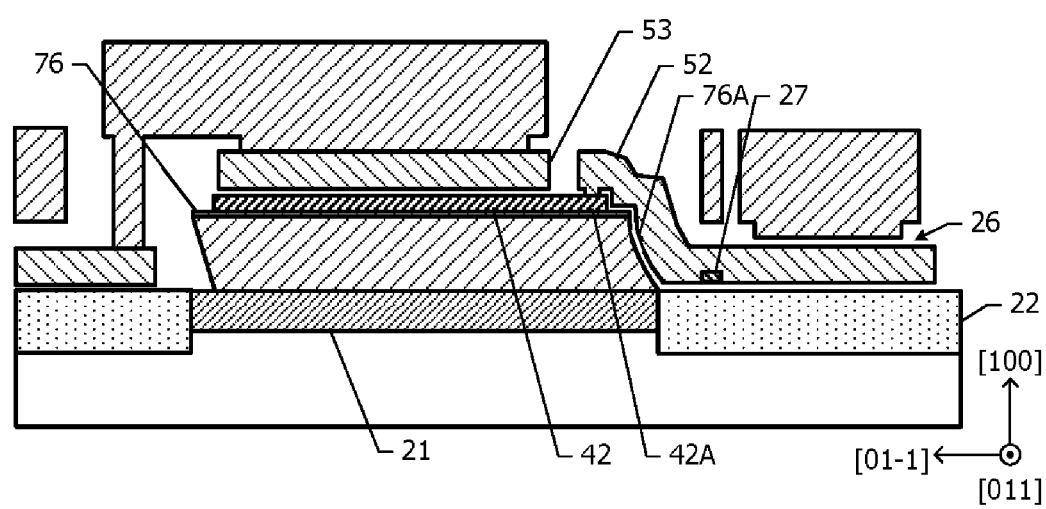

FIG. 10 is a plan view of the semiconductor device according to the fifth embodiment. FIGS. 11A and 11B are sectional views taken along the dash-dotted lines 11A-11A and 11B-11B, respectively, in FIG. 10. In the second embodiment, the first mesa portion 71 and the second mesa portion 72 (FIG. 3A) are formed by mesa-etching the base layer 31 and the collector layer 30. Steps provided at edges of the base layer 31 have a height reaching the bottom surface of the collector layer 30.

In contrast, in the fifth embodiment, a mesa portion 76 with a one-level structure is formed by mesa-etching the base layer 31 and the collector layer 30 up to the upper surface of the sub-collector layer 21. The ballast resistor 27 and the input capacitor 26 are arranged on the insulating area 22 (FIG. 11B) of the sub-collector layer 21 outside the mesa portion 76.

Paired conductor portions constituting the emitter electrodes 43 are arranged on both sides of the base electrode 42. The first-layer emitter wires 53 pass above the base electrode 42 and interconnect the paired conductor portions constituting the emitter electrodes 43.

The base electrode 42 is extended in the [0-11] direction from inside to outside of an area where the emitter layers 32 are arranged and an area where the first-layer emitter wires 53 are arranged. The base electrode 42 includes a widened portion 42A, which becomes wider in an inverted tapered shape as the widened portion 42A extends farther away from the emitter layers 32 and the first-layer emitter wires 53 in the [0-11] direction. The base wire 52 is connected to the widened portion 42A of the base electrode 42. The base wire 52 intersects with an edge of the mesa portion 76 (that is, an edge of the base layer 31) and is extended in the [0-11] direction to the outside of the base layer 31.

An edge 31A of the base layer 31 extends in the [011] direction and [0-1-1] direction from the intersection of an edge of the base layer 31 and the base wire 52. An edge 31B of the base layer 31 extends in a direction shifted from the [011] direction, such as a direction that forms an angle of 45° relative to the [011] direction, at a place where an edge of the base layer 31 and the base wire 52 overlap each other. An inverted mesa step is formed at the edge 31A of the base layer 31. A step that is substantially perpendicular to the upper surface of the semiconductor substrate 20 or a forward mesa step 76A (FIG. 11B) is formed at the edge 31B of the base layer 31.

In the fifth embodiment, the mesa portion 76 can be formed only by anisotropic wet etching, without applying dry etching. Although an inverted mesa step is formed at a position corresponding to the edge 31A of the base layer 31 orthogonal to a direction in which the base wire 52 extends, a substantially perpendicular step or the forward mesa step 76A (FIG. 11B) is formed at a position corresponding to the edge 31B overlapping the base wire 52. Therefore, the advantageous effect that the disconnection of the base wire 52 is less likely to occur is achieved.

Sixth Embodiment

Next, referring to FIGS. 12, 13A, and 13B, a semiconductor device according to a sixth embodiment will be described. Hereinafter, descriptions of configurations that are common to those of the semiconductor device according to the fifth embodiment (FIGS. 10, 11A, and 11B) will be omitted.

Figure 12:
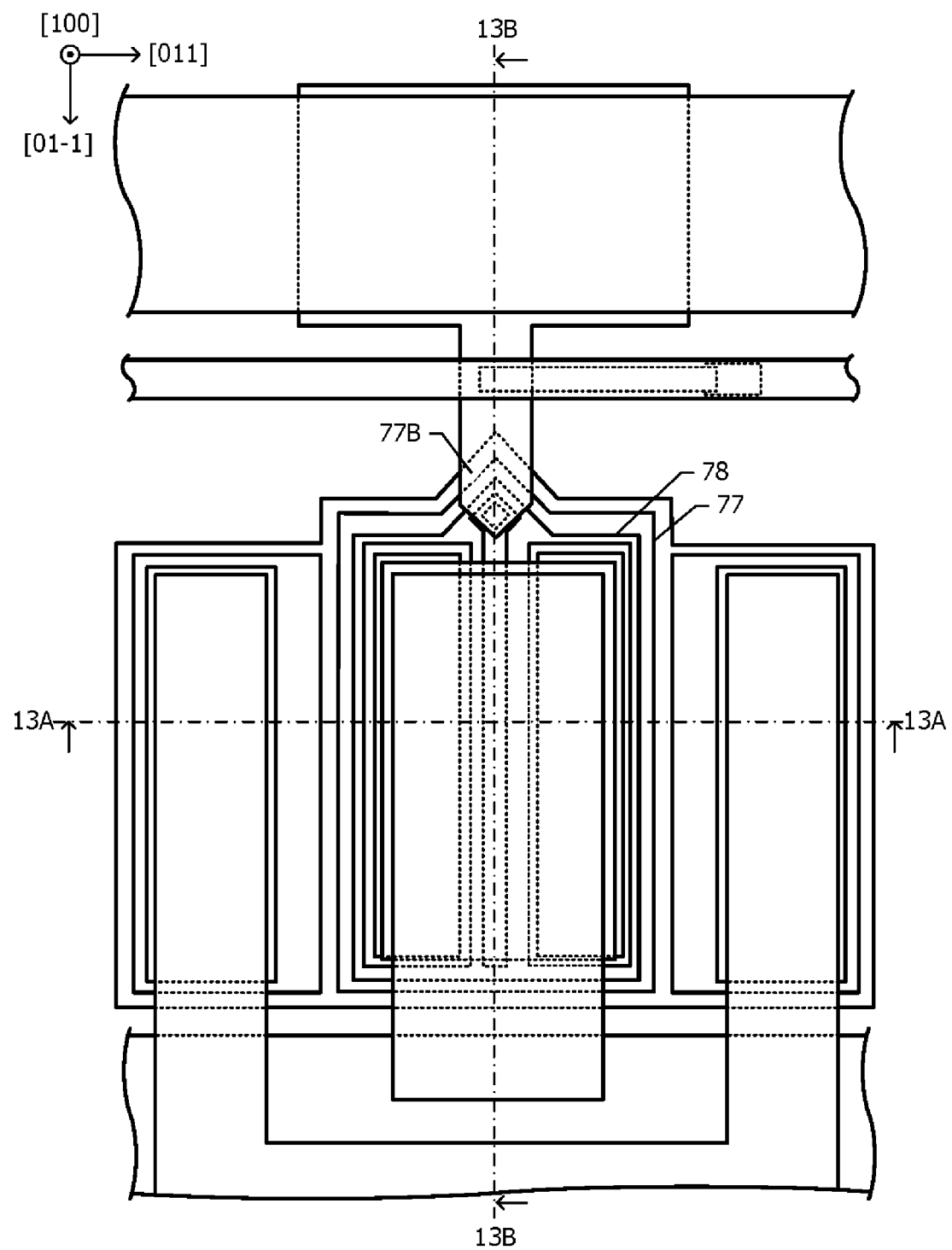
FIG. 12 is a plan view of a semiconductor device according to a sixth embodiment.
Figure 13A:
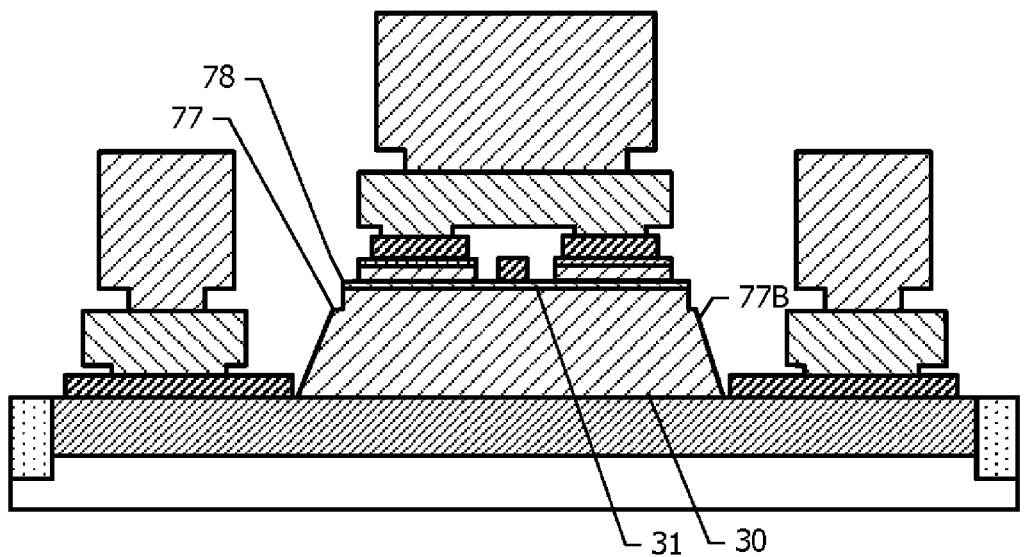
FIGS. 13A and 13B are sectional views taken along the dash-dotted lines 13A-13A and 13B-13B, respectively, in FIG. 12.
Figure 13B:
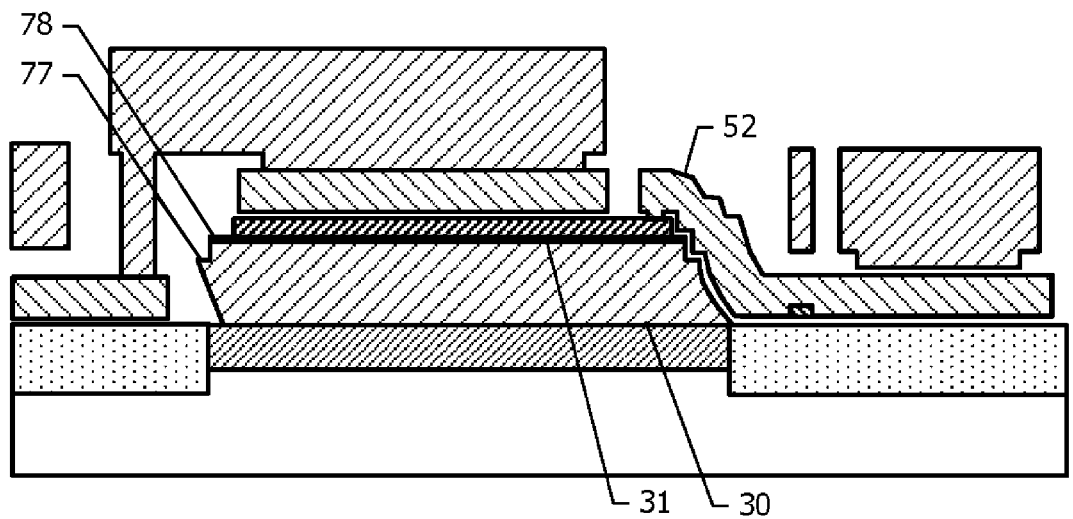

FIG. 12 is a plan view of the semiconductor device according to the sixth embodiment. FIGS. 13A and 13B are sectional views taken along the dash-dotted lines 13A-13A and 13B-13B, respectively, in FIG. 12. In the fifth embodiment, the mesa portion 76 with a one-level structure (FIGS. 11A and 11B) is formed by mesa-etching the base layer 31 and the collector layer 30. In contrast, in the sixth embodiment, a mesa portion with a two-level structure including a first mesa portion 77 and a second mesa portion 78 is formed.

The second mesa portion 78, which serves as the upper level, is provided on the first mesa portion 77, which serves as the lower level. The second mesa portion 78 is formed by dry etching the base layer 31 and the surface portion of the collector layer 30. The first mesa portion 77 is formed by wet etching the lower layer portion of the collector layer 30. Substantially perpendicular steps are formed at edges of the second mesa portion 78.

The structure of the intersection of the base wire 52 and each edge of the first mesa portion 77 is the same as the structure of the intersection of the base wire 52 and each edge of the mesa portion 76 (FIGS. 10 and 11B) in the fifth embodiment. That is, substantially perpendicular steps or forward mesa steps are provided at the intersection of the base wire 52 and edges 77B of the first mesa portion 77.

Starting from the inside of the base layer 31, the base wire 52 intersects with an edge of the second mesa portion 78 where a substantially perpendicular step is formed, intersects with an edge of the first mesa portion 77 where a substantially perpendicular or forward mesa step is formed, and is extended to the outside of the first mesa portion 77. Because a step through which the base wire 52 passes has a two-level structure in the sixth embodiment, the height of each step per level becomes lower than that in the case of the fifth embodiment. Therefore, the disconnection of the base wire 52 is less likely to occur.

Next, referring to FIGS. 14A, 14B, and 15, excellent advantageous effects of the semiconductor devices according to the fifth and sixth embodiments will be described in comparison with a reference example. A safe operation area (SOA) evaluation test of the HBT is conducted on a sample similar to the semiconductor devices according to the fifth and sixth embodiments (hereinafter referred to as an embodiment-similar sample) and a sample of a semiconductor device according to a reference example (hereinafter referred to as a reference example sample).

Figure 14A:
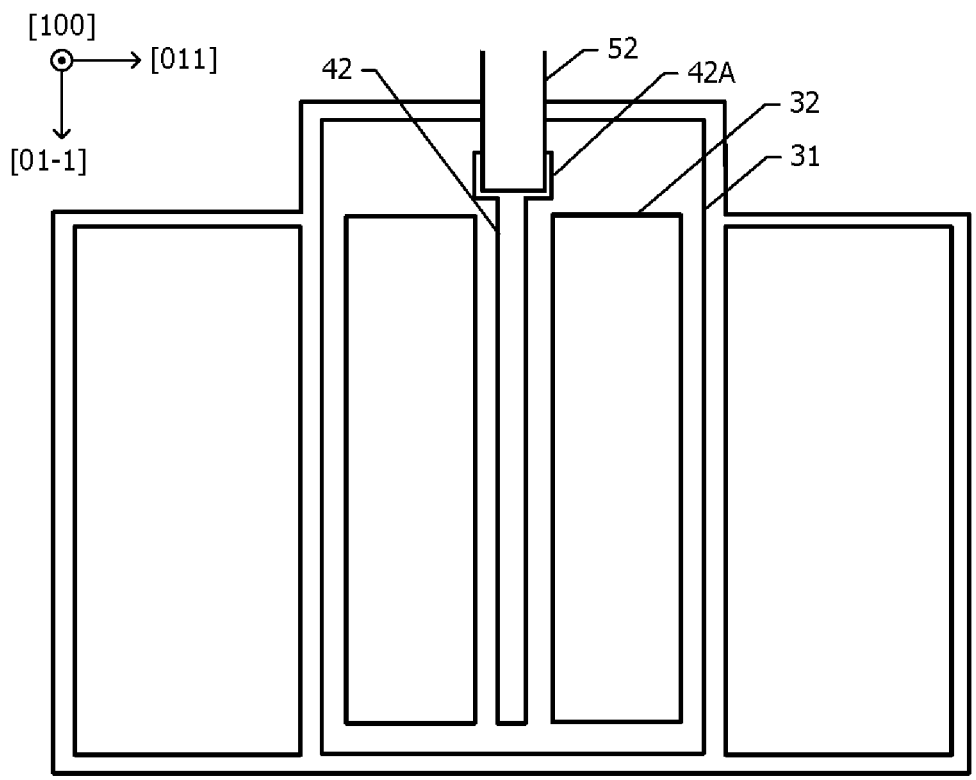
FIG. 14A is a schematic plan view of an embodiment-similar sample.

FIG. 14A is a schematic plan view of the embodiment-similar sample. The base electrode 42 is arranged between the pair of semiconductor portions constituting the emitter layers 32. The widened portion 42A, which is wider than the other area, is provided in one of two end portions of the base electrode 42. In the fifth embodiment (FIG. 10) and the sixth embodiment (FIG. 12), the width of the widened portion 42A gradually becomes greater as the widened portion 42A extends farther away from the emitter layers 32 in the [0-11] direction. In contrast, the width of the base wire 52 becomes greater discontinuously from a certain position in the embodiment-similar sample. The maximum width of the widened portion 42A in the embodiment-similar sample is substantially equal to the maximum width of the widened portion 42A of the semiconductor devices according to the fifth embodiment (FIG. 10) and the sixth embodiment (FIG. 12).

Figure 14B:
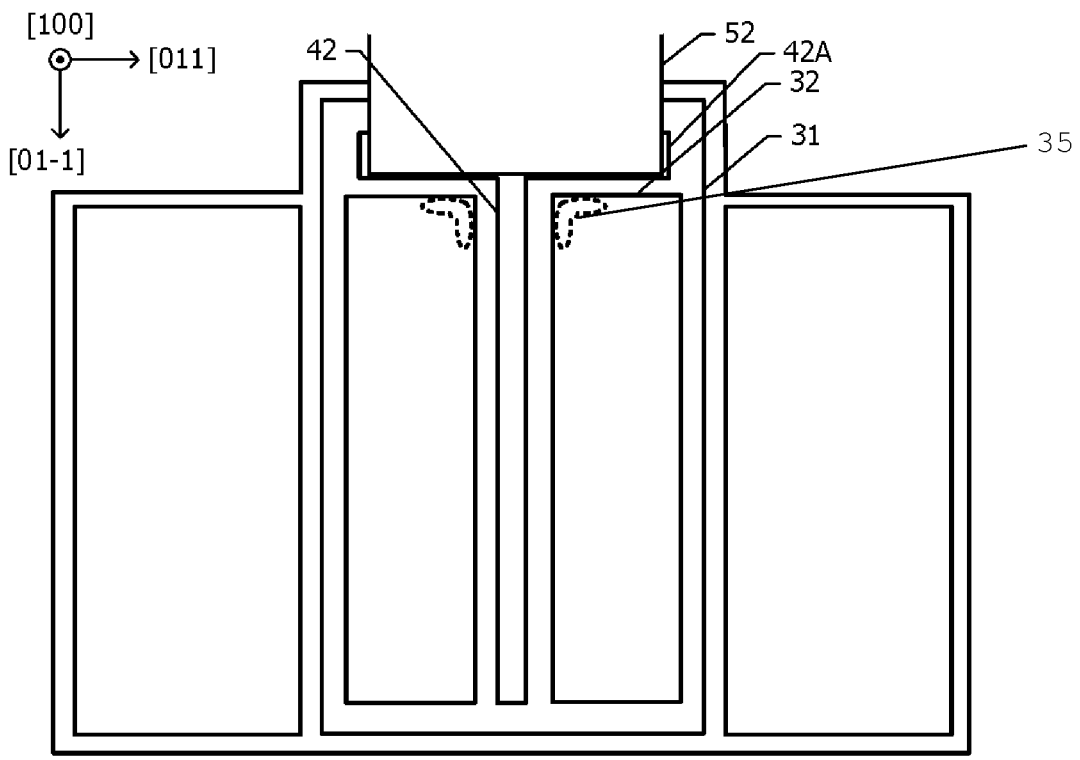
FIG. 14B is a schematic plan view of a reference example sample.

FIG. 14B is a schematic plan view of the reference example sample. The width in the [011] direction of the widened portion 42A in the reference example sample is wider than that in the embodiment-similar sample (FIG. 14A). Specifically, the widened portion 42A spreads in the [011] direction toward the vicinity of edges at two ends of the paired semiconductor portions of the emitter layers 32.

In the reference example sample (FIG. 14B), base current flows from both of the main portion and the widened portion 42A of the base electrode 42 to the base layer 31 around the connection point of the main portion and the widened portion 42A of the base electrode 42. Therefore, the base resistance becomes relatively smaller around the connection point of the main portion and the widened portion 42A of the base electrode 42. The collector current density becomes relatively greater at corner portions 35 of the emitter layers 32 corresponding to areas where the base resistance becomes small. Since the temperature of an area where the collector current density becomes relatively greater becomes higher than that in the other area, the heat-caused destruction is likely to occur near the corner portions 35.

In contrast, because the width of the widened portion 42A in the embodiment-similar sample (FIG. 14A) is narrower than that in the reference example sample (FIG. 14B), the extent to which the base resistance decreases is small, and the degree to which the collector current density becomes relatively great is also low. Therefore, the breakdown tolerance is improved, compared with the reference example sample.

Figure 15:
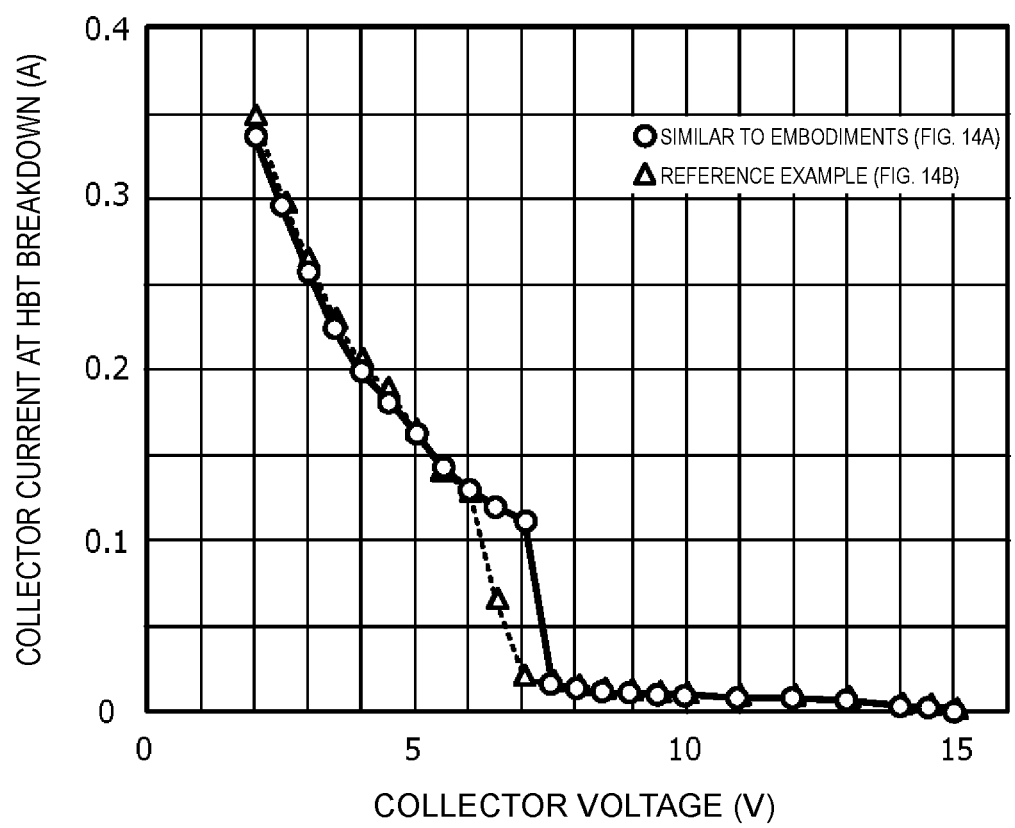
FIG. 15 is a graph illustrating the results of a safe operation area (SOA) evaluation test of the embodiment-similar sample (FIG. 14A) and the reference example sample (FIG. 14B).

FIG. 15 is a graph illustrating the results of a safe operation area (SOA) evaluation test of the embodiment-similar sample (FIG. 14A) and the reference example sample (FIG. 14B). The horizontal axis represents the collector voltage in the unit "V", and the perpendicular axis represents the collector current in the unit "A" at HBT breakdown. Circle symbols and triangle symbols in the graph of FIG. 15 represent the evaluation results of the embodiment-similar sample (FIG. 14A) and the reference example sample (FIG. 14B), respectively. It has been confirmed that the SOA of the embodiment-similar sample is wider than that of the reference example sample.

In the embodiment-similar sample (FIG. 14A), the local reduction of the base resistance is suppressed by adjusting the width of the widened portion 42A of the base electrode 42. As in the fifth embodiment (FIG. 10) and the sixth embodiment (FIG. 12), the local reduction of the base resistance can be suppressed also by making the width of the widened portion 42A an inverted tapered shape that gradually becomes wider as the widened portion 42A extends farther away from the emitter layers 32 in the [0-11] direction. As a result, the breakdown tolerance can be improved.

Seventh Embodiment

Next, referring to FIGS. 16, 17A, and 17B, a semiconductor device according to a seventh embodiment will be described. Hereinafter, descriptions of configurations that are common to those of the semiconductor devices according to the first to sixth embodiments will be omitted.

Figure 16:
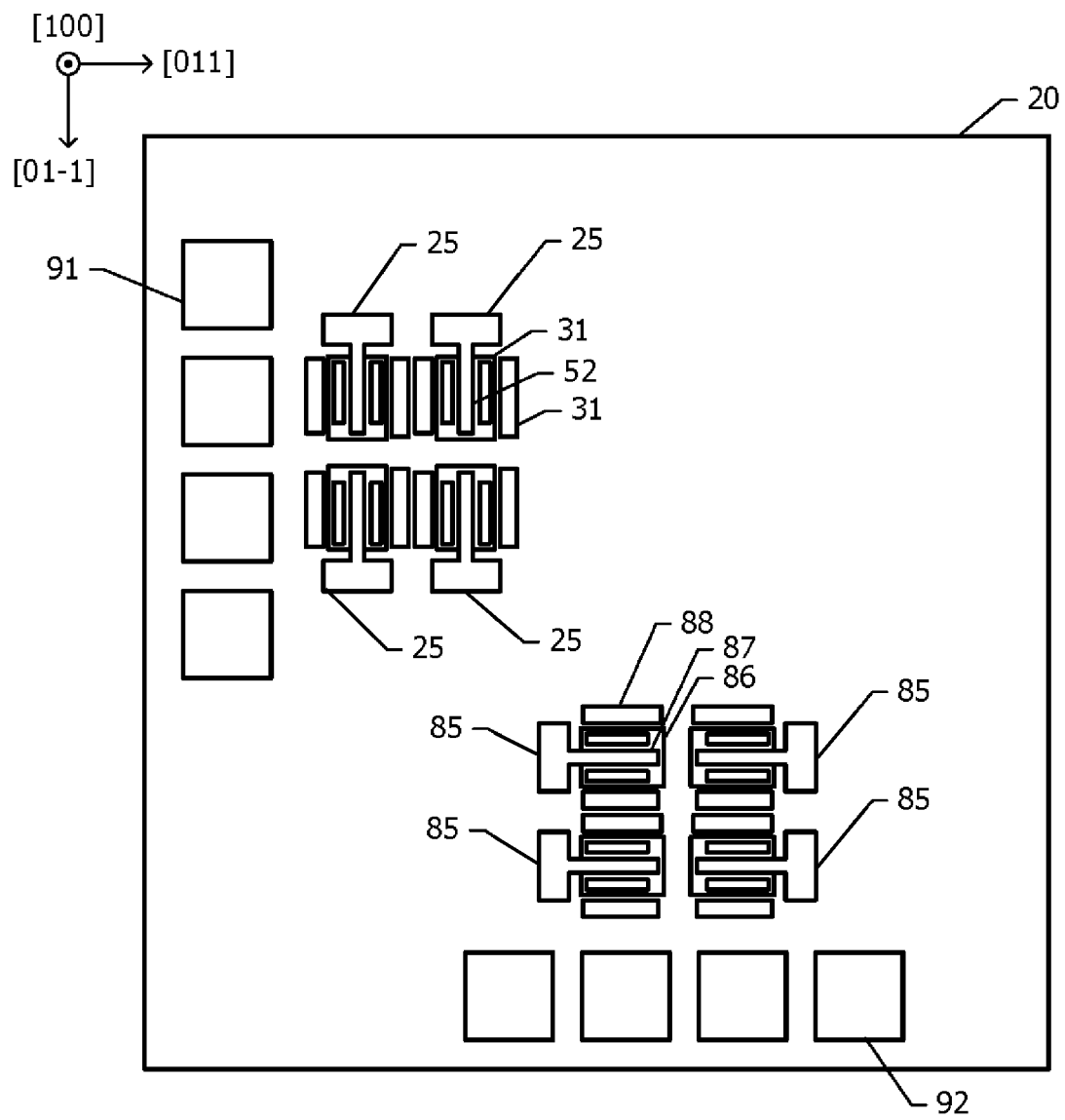
FIG. 16 is a schematic plan view of a semiconductor device according to a seventh embodiment.

FIG. 16 is a schematic plan view of the semiconductor device according to the seventh embodiment. A plurality of HBTs 25 belonging to a first group and a plurality of HBTs 85 belonging to a second group are formed on the semiconductor substrate 20. Each of the HBTs 25 belonging to the first group is such that, like the semiconductor device according to any of the first to sixth embodiments, the base wire 52 is extended from inside to outside of the base layer 31 in the [0-11] direction or a direction opposite to the [0-11] direction. A disconnection prevention structure which is similar to or the same as that of the semiconductor device according to any of the first to sixth embodiments is provided at the intersection of the base wire 52 and an edge of the base layer 31 of each of the HBTs 25. The collector electrodes 41 of the HBTs 25 belonging to the first group are connected to a plurality of pads 91. The pads 91 are arranged along but slightly behind an edge parallel to [01-1] direction of the semiconductor substrate 20.

The layout of the HBTs 85 belonging to the second group is equivalent to a layout where the HBTs 25 belonging to the first group are rotated by 90° while the relative positional relationship is maintained. Therefore, each of the HBTs 85 is such that a base wire 87 is extended from inside to outside of a base layer 86 in the [011] direction or a direction opposite to the [011] direction. Forward mesa steps are formed at edges of the base layer 86 that intersects with the base wire 87. Therefore, the disconnection of the base wire 87 is unlikely to occur at the intersection even without adopting a special disconnection prevention structure. Collector electrodes 88 of the HBTs 85 belonging to the second group are connected to a plurality of pads 92. It is preferable that the relative positional relationships between the HBTs 25 and 85 and the pads 91 and 92 connected to the HBTs 25 and 85, respectively, be common in design. Therefore, the pads 92 connected to the HBTs 85 are arranged along an edge extending in the [011] direction of the semiconductor substrate 20.

In a conventional semiconductor device, the disconnection is likely to occur since the base wire 52 of each of the HBTs 25 belonging to the first group passes through an inverted mesa step. In order to prevent the disconnection of the base wire 52, it has been necessary to arrange the HBTs 25 belonging to the first group in an orientation identical to that of the HBTs 85 belonging to the second group.

In contrast, in the seventh embodiment, the HBTs 25 belonging to the first group can be arranged in a 90°-rotated orientation from the orientation of the HBTs 85 belonging to the second group. Furthermore, the pads 91 connected to the HBTs 25 belonging to the first group, and the pads 92 connected to the HBTs 85 belonging to the second group can be arranged along two edges orthogonal to each other.

Figure 17A:
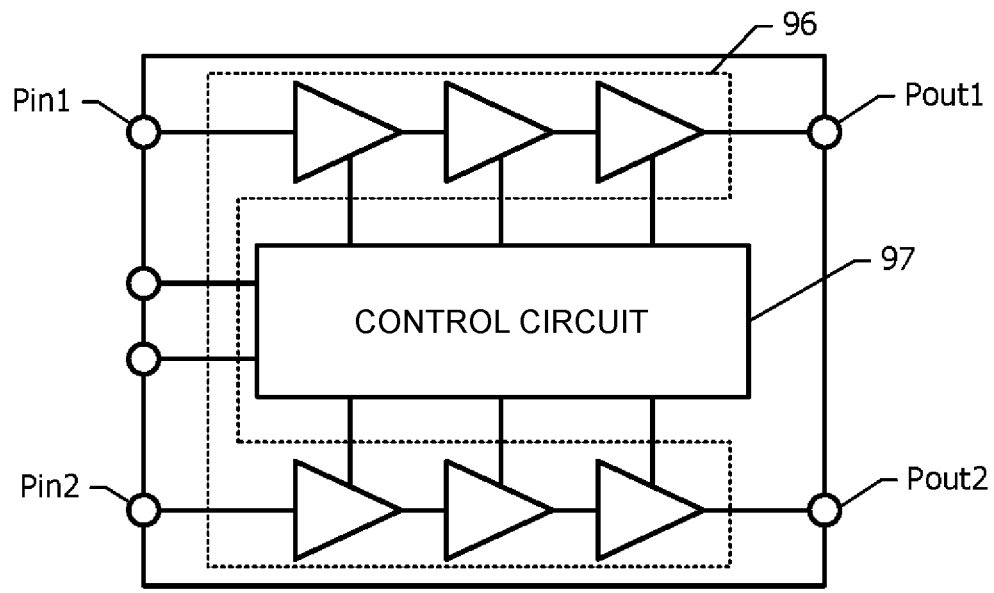
FIG. 17A is a block diagram of a power amplifier module using the semiconductor device according to the seventh embodiment.
Figure 17B:
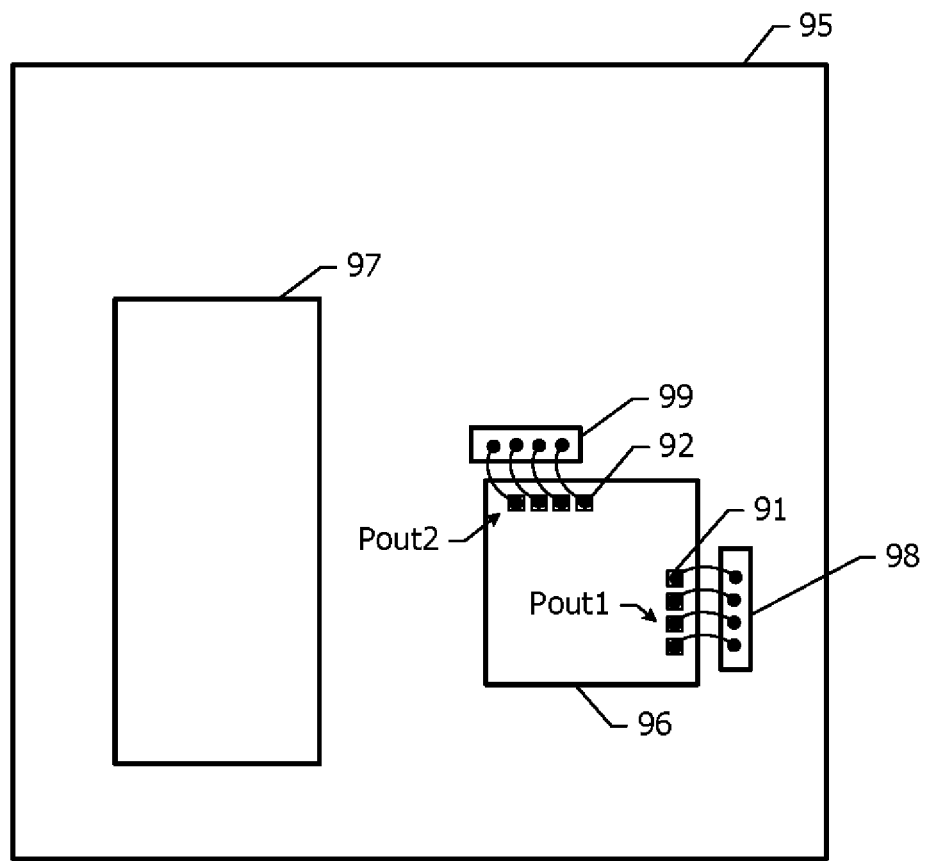
FIG. 17B is a schematic plan view of the power amplifier module.

FIG. 17A is a block diagram of a power amplifier module using the semiconductor device according to the seventh embodiment, and FIG. 17B is a schematic plan view of the power amplifier module. A semiconductor device 96 according to the seventh embodiment and a control IC 97 are mounted on a mounting substrate 95 (FIG. 17B).

The power amplifier module has two systems of amplifier circuits, as illustrated in FIG. 17A. The first-system amplifier circuit amplifies a signal inputted from an input terminal Pin1 and outputs the amplified signal to an output terminal Pout1. The second-system amplifier circuit amplifies a signal inputted from an input terminal Pin2 and outputs the amplified signal to an output terminal Pout2. These two systems of amplifier circuits are realized by the semiconductor device 96 according to the seventh embodiment. For example, the first-system amplifier circuit includes the HBTs 25 (FIG. 16) belonging to the first group, and the second-system amplifier circuit includes the HBTs 85 (FIG. 16) belonging to the second group. The output terminals Pout1 and Pout2 correspond to the pads 91 and 92, respectively.

The pads 91 are connected by bonding wires to a first land 98 of the mounting substrate 95, and the pads 92 are connected by bonding wires to a second land 99 of the mounting substrate 95. The first land 98 and the second land 99 are arranged at positions corresponding to two edges that are orthogonal to each other of the semiconductor device 96, along these edges.

As has been described above, with the use of the semiconductor device 96 according to the seventh embodiment as the amplifier circuits, the two lands, the first land 98 and the second land 99, for obtaining two systems of output signals can be arranged correspondingly to two edges that are orthogonal to each other of the semiconductor device 96. Accordingly, the degree of freedom in designing the mounting substrate 95 is enhanced.

The above-described embodiments are exemplary, and, needless to say, a partial replacement or combination of configurations discussed in different embodiments is possible. The same or similar advantageous effects achieved by the same or similar configurations in a plurality of embodiments will not be mentioned in each of the embodiments. Furthermore, the present disclosure is not limited to the above-described embodiments. For example, it is obvious for those skilled in the art that various modifications, improvements, combinations, and the like can be made.

The invention claimed is:

1. A semiconductor device comprising:
a single-crystal semiconductor substrate with an upper surface;
a first bipolar transistor including a first collector layer, a first base layer, and a first emitter layer, wherein the first collector layer, the first base layer, and the first emitter layer are epitaxially grown on the semiconductor substrate, wherein the first collector layer has a rectangular shape when the semiconductor device is viewed in a plan view, and a short-side direction of the rectangular shape is a first direction and a long-side direction of the rectangular shape is a second direction orthogonal to the first direction; and
a first base wire connected to the first base layer, wherein:
a step is provided at an edge of the first base layer, the first base wire is extended from inside to outside of the first base layer in a direction intersecting with the first direction in a plan view, and
an intersection of the edge of the first base layer and the first base wire has a disconnection prevention structure making it difficult for step-caused disconnection of the first base wire to occur, compared with a structure in which an inverted mesa step formed by anisotropic etching of the first base layer and the first collector layer intersects with the first base layer, wherein the base wire is extended from inside to outside of the base layer as a straight line in the second direction.

2. The semiconductor device according to claim 1, further comprising:
a sub-collector layer provided between the semiconductor substrate and the first collector layer, the sub-collector layer having a higher dopant concentration than the first collector layer, wherein:
a step with a height reaching the sub-collector layer is provided at an edge of the first collector layer,
a first collector electrode ohmic-connected to the sub-collector layer outside the first collector layer is provided,
a circuit element arranged on the first collector layer outside the first base layer and connected to the first base wire is provided, the first collector layer spreading outside the first base layer,
an inverted mesa step is formed at an edge extending in the first direction of the first collector layer, and
the step provided at the edge of the first base layer is made perpendicular to the upper surface of the semiconductor substrate or made into a forward mesa step in the first direction, thereby configuring the disconnection prevention structure.

3. The semiconductor device according to claim 2, further comprising:
a first base electrode ohmic-connected to the first base layer, wherein:
the first base wire includes a straight-line portion extending linearly from the edge of the first base layer to the inside of the first base layer in a plan view,
the first base electrode includes a straight-line portion overlapping with the straight-line portion of the first base wire,
the straight-line portion of the first base wire is connected to the straight-line portion of the first base electrode, and
semiconductor portions each constituting the first emitter layer are arranged on both sides of the first base electrode.

4. The semiconductor device according to claim 3, wherein:
a dimension in a height direction of the step provided at the edge of the first base layer is smaller than a dimension in a thickness direction of the first base wire.

5. The semiconductor device according to claim 3, further comprising:
a second bipolar transistor including a second collector layer, a second base layer, and a second emitter layer, wherein the second collector layer, the second base layer, and the second emitter layer are epitaxially grown on the semiconductor substrate; and
a second base wire connected to the second base layer, wherein:
a step is provided at an edge of the second base layer, and
the second base wire is extended from inside to outside of the second base layer so as to intersect with an edge extending in the second direction of the second base layer in a plan view.

6. The semiconductor device according to claim 2, wherein:
a dimension in a height direction of the step provided at the edge of the first base layer is smaller than a dimension in a thickness direction of the first base wire.

7. The semiconductor device according to claim 2, further comprising:

a second bipolar transistor including a second collector layer, a second base layer, and a second emitter layer, wherein the second collector layer, the second base layer, and the second emitter layer are epitaxially grown on the semiconductor substrate; and
a second base wire connected to the second base layer, wherein:
a step is provided at an edge of the second base layer, and the second base wire is extended from inside to outside of the second base layer so as to intersect with an edge extending in the second direction of the second base layer in a plan view.

8. The semiconductor device according to claim 1, wherein:
a dimension in a height direction of the step provided at the edge of the first base layer is smaller than a dimension in a thickness direction of the first base wire.

9. The semiconductor device according to claim 8, further comprising:
a second bipolar transistor including a second collector layer, a second base layer, and a second emitter layer, wherein the second collector layer, the second base layer, and the second emitter layer are epitaxially grown on the semiconductor substrate; and
a second base wire connected to the second base layer, wherein:
a step is provided at an edge of the second base layer, and the second base wire is extended from inside to outside of the second base layer so as to intersect with an edge extending in the second direction of the second base layer in a plan view.

10. The semiconductor device according to claim 1, wherein:
the step provided at the edge of the first base layer has a height reaching a bottom surface of the first collector layer,
the edge of the first base layer extends in the first direction from the intersection of the edge of the first base layer and the first base wire,
the edge of the first base layer extends in a direction shifted from the first direction at a place where the edge of the first base layer and the first base wire overlap with each other, and
the step provided at the edge of the first base layer is an inverted mesa step on both sides of the first base wire, and is perpendicular or is a forward mesa step at a position overlapping the first base wire, thereby configuring the disconnection prevention structure.

11. The semiconductor device according to claim 10, further comprising:
a first base electrode arranged on the first base layer and having a linear shape extending in the second direction, wherein:
semiconductor portions each constituting the first emitter layer are arranged on both sides of the first base electrode,
the first base electrode extends to outside an area where the first emitter layers are arranged regarding the second direction, and includes a widened portion being wider in an inverted tapered shape as the widened portion extends farther away from the first emitter layers in the second direction, and
the first base wire is connected to the widened portion of the first base electrode.

12. The semiconductor device according to claim 11, further comprising:

a second bipolar transistor including a second collector layer, a second base layer, and a second emitter layer, wherein the second collector layer, the second base layer, and the second emitter layer are epitaxially grown on the semiconductor substrate; and a second base wire connected to the second base layer, wherein:

a step is provided at an edge of the second base layer, and the second base wire is extended from inside to outside of the second base layer so as to intersect with an edge extending in the second direction of the second base layer in a plan view.

13. The semiconductor device according to claim 10, further comprising:

a second bipolar transistor including a second collector layer, a second base layer, and a second emitter layer, wherein the second collector layer, the second base layer, and the second emitter layer are epitaxially grown on the semiconductor substrate; and a second base wire connected to the second base layer, wherein:

a step is provided at an edge of the second base layer, and the second base wire is extended from inside to outside of the second base layer so as to intersect with an edge extending in the second direction of the second base layer in a plan view.

14. The semiconductor device according to claim 1, further comprising:

a second bipolar transistor including a second collector layer, a second base layer, and a second emitter layer, wherein the second collector layer, the second base layer, and the second emitter layer are epitaxially grown on the semiconductor substrate; and a second base wire connected to the second base layer, wherein:

a step is provided at an edge of the second base layer, and the second base wire is extended from inside to outside of the second base layer so as to intersect with an edge extending in the second direction of the second base layer in a plan view.

\* \* \* \* \*